United States Patent
Ueda et al.

(10) Patent No.: US 7,773,646 B2
(45) Date of Patent: Aug. 10, 2010

(54) SEMICONDUCTOR LIGHT SOURCE AND LIGHT-EMITTING DEVICE DRIVE CIRCUIT

(75) Inventors: Daisuke Ueda, Osaka (JP); Masaaki Yuri, Osaka (JP); Katsumi Sugiura, Kyoto (JP); Kenichi Matsuda, Kyoto (JP)

(73) Assignee: Panasonic Corporation, Osaka (JP)

( * ) Notice: Subject to any disclaimer, the term of this patent is extended or adjusted under 35 U.S.C. 154(b) by 20 days.

(21) Appl. No.: 12/280,603

(22) PCT Filed: Mar. 14, 2007

(86) PCT No.: PCT/JP2007/055090

§ 371 (c)(1),
(2), (4) Date: Aug. 25, 2008

(87) PCT Pub. No.: WO2007/138774

PCT Pub. Date: Dec. 6, 2007

(65) Prior Publication Data

US 2009/0014752 A1  Jan. 15, 2009

(30) Foreign Application Priority Data

May 31, 2006  (JP) .............................. 2006-151646

(51) Int. Cl.
*H01S 3/00* (2006.01)
(52) U.S. Cl. ............... 372/38.02; 372/38.1; 372/38.01; 372/38.07; 372/43.01; 372/45.01
(58) Field of Classification Search ................ 372/38.1, 372/38.01, 38.02, 38.03, 38.07, 43.01, 45.01
See application file for complete search history.

(56) References Cited

U.S. PATENT DOCUMENTS 5,306,662 A    4/1994   Nakamura et al.

(Continued)

FOREIGN PATENT DOCUMENTS

JP           51-19985       2/1976

(Continued)

OTHER PUBLICATIONS

Tomiya, S., et al., "Dislocation Related Issued in the Degradation of GaN-Based Laser Diodes", IEEE Journal of Selected Topics in Quantum Electronics, Nov.-Dec. 2004, pp. 1277-1286, vol. 10 No. 6, IEEE.

(Continued)

*Primary Examiner*—Minsun Harvey
*Assistant Examiner*—Yuanda Zhang
(74) *Attorney, Agent, or Firm*—McDermott Will & Emery LLP

(57) ABSTRACT

A semiconductor light source includes a light-emitting device 101 having a plurality of semiconductor layers made of nitride semiconductors, and a drive circuit 102 for driving the light-emitting device 101. The drive circuit 102 performs forward drive operation, in which a forward current is supplied to the light-emitting device to make the light-emitting device 101 emit light, and reverse drive operation, in which a reverse bias is applied to the light-emitting device. The magnitude of the reverse bias is limited by the value of a reverse current flowing through the light-emitting device.

13 Claims, 11 Drawing Sheets

U.S. PATENT DOCUMENTS

| | | | |
|---|---|---|---|
| 5,701,035 A | 12/1997 | Teraguchi | |
| 5,834,326 A | 11/1998 | Miyachi et al. | |
| 6,724,793 B2 * | 4/2004 | Nagara | 372/38.02 |
| 6,870,193 B2 | 3/2005 | Takeya et al. | |
| 6,911,079 B2 | 6/2005 | Rice et al. | |
| 7,190,641 B2 | 3/2007 | Fujiie et al. | |
| 2004/0206970 A1 | 10/2004 | Martin | |
| 2005/0117616 A1 | 6/2005 | Yamasaki et al. | |
| 2006/0044864 A1 | 3/2006 | Lin et al. | |
| 2006/0061302 A1 | 3/2006 | Kato et al. | |
| 2006/0187988 A1 * | 8/2006 | Tanaka | 372/45.01 |

FOREIGN PATENT DOCUMENTS

| | | |
|---|---|---|
| JP | 5-183189 | 7/1993 |
| JP | 5-218544 | 8/1993 |
| JP | 05-218544 | 8/1993 |
| JP | 6-232450 | 8/1994 |
| JP | 8-032115 | 2/1996 |
| JP | 9-162442 | 6/1997 |
| JP | 2002-075910 | 3/2002 |
| JP | 2002-158395 | 5/2002 |
| JP | 2002-335052 | 11/2002 |
| JP | 2003-163412 | 6/2003 |
| JP | 2003-174237 | 6/2003 |
| JP | 2004-320024 | 11/2004 |
| JP | 2006-073979 | 3/2006 |
| JP | 2006-086336 | 3/2006 |

OTHER PUBLICATIONS

Chinese Office Action, with English Translation, issued in Chinese Patent Application No. 200780001710.4, dated Feb. 12, 2010.

* cited by examiner

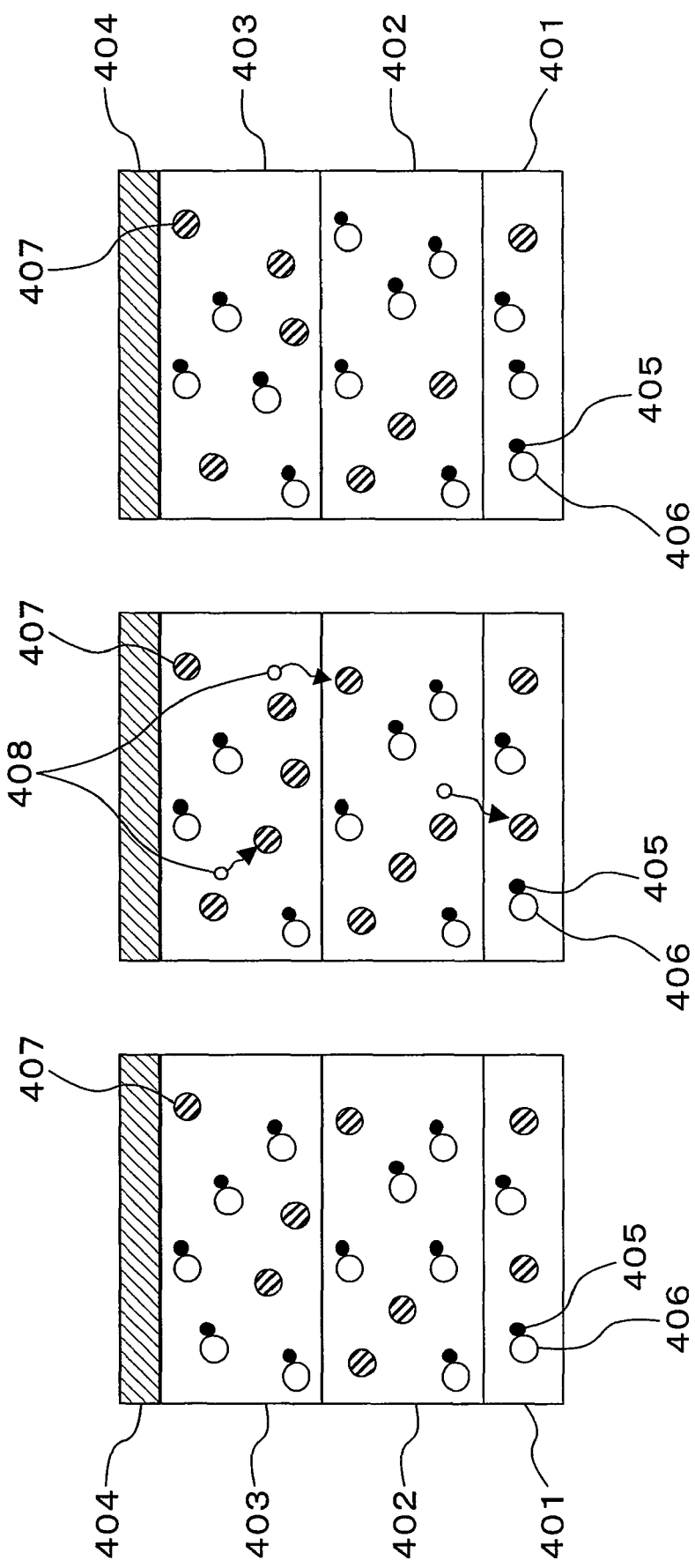

FIG.5A
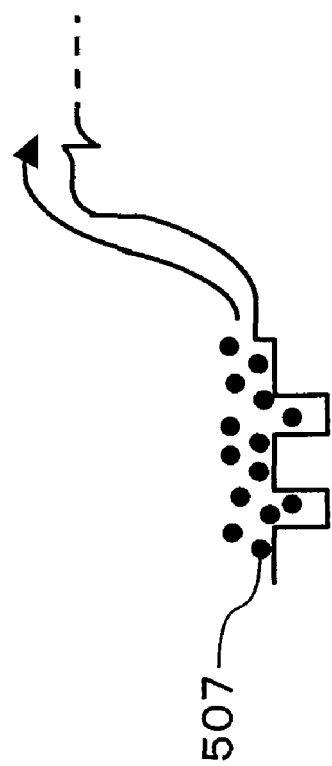
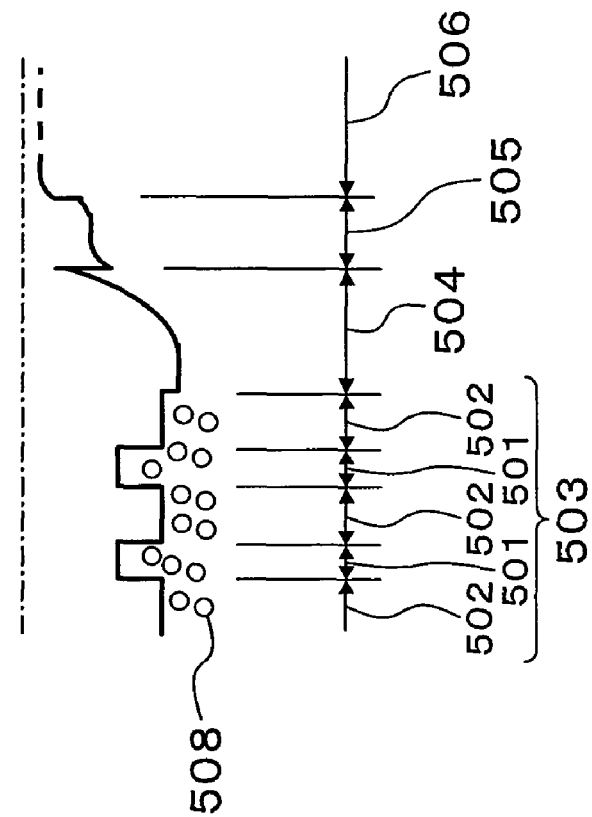
FIG.5B
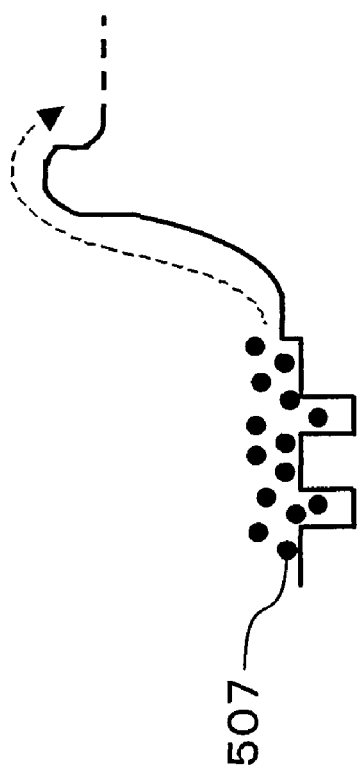
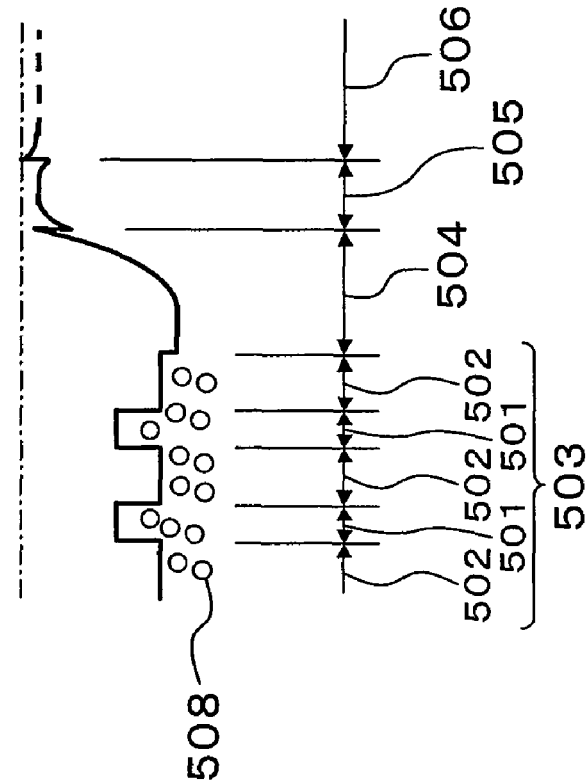

SEMICONDUCTOR LIGHT SOURCE AND LIGHT-EMITTING DEVICE DRIVE CIRCUIT

RELATED APPLICATIONS

This application is the U.S. National Phase under 35 U.S.C. §371 of International Application No. PCT/JP2007/055090, filed on Mar. 14, 2007, which in turn claims the benefit of Japanese Application No. 2006-151646, filed on May 31, 2006, the disclosures of which Applications are incorporated by reference herein.

TECHNICAL FIELD

The present invention relates to a semiconductor light source including a nitride semiconductor light-emitting device, particularly a nitride semiconductor laser device or a nitride semiconductor light-emitting diode, for use in an optical pickup or in a solid-state lighting system, etc., and to a light-emitting device drive circuit.

BACKGROUND ART

As the oscillation wavelength of a semiconductor laser device incorporated into an optical pickup used for reproduction and recording of an optical disk is shortened, the recording density of the optical disk is increased. Thus, nitride semiconductor laser devices which oscillate at wavelengths ranging from blue to violet have been developed, and optical pickups using such nitride semiconductor laser devices have been applied to practical use. Also, nitride semiconductor laser devices that oscillate in the ultraviolet region may be applied to solid-state lighting systems that excite fluorescent material by ultraviolet light, and these solid-state lighting systems are expected to replace fluorescent lamps. On the other hand, light-emitting diodes made of nitride semiconductors are used as blue or white light emitting diodes.

Looking back on the history of the development of nitride semiconductor light-emitting diodes and nitride semiconductor laser devices, there was a major challenge in that it was difficult to obtain low-resistance p-type crystals for nitride semiconductors. It was known that nitride semiconductors, for instance gallium nitride (GaN), were semiconductor materials having numerous lattice defects and, when not doped with a dopant, exhibited n-type conductivity because of nitrogen holes produced in the crystals. Furthermore, even if a nitride semiconductor was doped with a p-type dopant, the nitride semiconductor only became high-resistance i-type, and it was thus difficult to obtain low-resistance p-type crystals.

To address this, a technique was developed in which a p-type semiconductor is obtained by heat-treating a nitride semiconductor doped with a p-type dopant (see Patent Document 1, for example). This technique is based on the assumption that hydrogen (H) present in the semiconductor binds to magnesium (Mg) serving as the p-type dopant and thus prevents the Mg from functioning as an acceptor, resulting in high resistance. In this technique, therefore, gallium nitride (GaN) doped with Mg is heat-treated to remove hydrogen (H) and hence allow the Mg to function properly as an acceptor, thereby obtaining low-resistance p-type gallium nitride. Since the publication of this technique, various research institutes have conducted research on activation heat-treatment techniques for obtaining p-type nitride semiconductors.

Nevertheless, even with those activation heat-treatment techniques, it was still difficult to completely remove hydrogen (H) from a p-type nitride semiconductor. Therefore, a technique was developed in which residual hydrogen remaining in a nitride semiconductor layer is attracted by a metal hydride layer, thereby promoting activation of magnesium (Mg) (see Patent Document 2, for example). This technique particularly aims to increase the carrier concentration in a p-type contact layer that forms an ohmic electrode, and adopts a configuration in which a metal hydride layer is interposed between the p-type contact layer made of a nitride semiconductor and an electrode. Since this metal hydride layer promotes the activation of Mg and permits the contact layer to have a sufficiently high carrier concentration, an ohmic contact whose contact resistance is very low is achievable. However, the inventor of Patent Document 2 himself mentioned that the ohmic contact formed with this technique had a problem in stability over time. And to overcome this problem, the inventor disclosed a technique in which a hydrogen absorber metal is deposited and then removed and an electrode is formed again (see Patent Document 3, for example).

In the foregoing, the background art for the p-type nitride semiconductor formation method and the reliability of a p-type nitride semiconductor used as a contact layer have been described. Next, background art for reliability testing on a nitride semiconductor laser device will be described. A life test was conducted on a nitride semiconductor laser device, and the results of a study of a deterioration mechanism in the nitride semiconductor laser device have been reported (see Non-Patent Document 1, for example). This nitride semiconductor laser device has a configuration shown in FIG. 11.

As shown in FIG. 11, a buffer layer 1102 made of n-type GaN is grown on a sapphire substrate 1101 using an ELO (epitaxial lateral overgrowth) technique. Subsequently, a cladding layer 1103 made of n-type AlGaN, a guide layer 1104 made of n-type GaN, a multi-quantum well active layer 1105, an overflow suppression layer 1106 made of p-type AlGaN, a guide layer 1107 made of p-type GaN, a superlattice cladding layer 1108 made of p-type AlGaN/GaN, and a contact layer 1109 made of p-type GaN are stacked in this order on the buffer layer 1102, thereby obtaining a laser structure.

The contact layer 1109 and the superlattice cladding layer 1108 are patterned by etching so as to have a striped ridge structure extending in directions coming out of and into the drawing. On the ridge structure, an insulating film 1110 having an opening, and a p-side electrode 1111 composed of a Pd/Pt/Au multilayer film are formed. An n-side electrode 1112 composed of a Ti/Pt/Au multilayer film is also formed on part of the buffer layer 1102 exposed by etching.

In Non-Patent Document 1, dislocation density in a long-life laser device is compared with that in a short-life laser device. The comparison results show that dislocation increase from through-dislocations, or structural change in through-dislocations, each well known as a deterioration mechanism in a gallium-arsenide(GaAs)-based or indium-phosphide (InP)-based laser device, was not observed. Also, since the rate of deterioration was proportional to the square root of the aging time, it was assumed that the deterioration developed through a diffusion process. And the conclusion was made that the deterioration was caused by the diffusion of defects to the active layer along dislocations.

Patent Document 1: Japanese Laid-Open Publication No. 5-183189

Patent Document 2: Japanese Laid-Open Publication No. 8-32115

Patent Document 3: Japanese Laid-Open Publication No. 2002-75910

Patent Document 4: Japanese Laid-Open Publication No. 2004-320024

Non-Patent Document 1: S. Tomiya et al., IEEE Journal of Selected Topics in Quantum Electronics, Vol. 10, No 6, pp 1277-1286, November/December 2004

DISCLOSURE OF THE INVENTION

Problem that the Invention Intends to Solve

Broadly speaking, the problem that the invention intends to solve is to extend the life of nitride semiconductor light-emitting devices. Although optical pickups using nitride semiconductor laser devices have been applied to practical use, the life thereof is shorter than that of AlGaAs-based or AlGaInP-based semiconductor laser devices. Realization of an optical pickup capable of faster reproduction and recording operation requires a higher output-power nitride semiconductor laser device, however, as the output power is increased, the life thereof tends to be shortened.

Also, in applying a nitride semiconductor light-emitting device to a solid-state lighting system, it is also indispensable to extend the life of the nitride semiconductor laser device. Furthermore, nitride semiconductor light-emitting diodes also must have their life increased, particularly when application thereof to high luminance required in white lighting, etc. is considered.

To be specific, the problem to be solved by the invention is to slow down process of a deterioration mechanism in a nitride semiconductor light-emitting device, which is different from the conventionally known deterioration mechanisms described in "BACKGROUND ART". However, this deterioration mechanism is an assumption made by the present inventors, and in fact, the present inventors found driving methods for slowing down deterioration of a nitride semiconductor light-emitting device, and this new deterioration mechanism is assumed as the reason for the effectiveness of these driving methods. This deterioration mechanism is assumed to be related to a p-type nitride-semiconductor formation method, particularly, residual hydrogen atoms in a p-type nitride semiconductor layer. This assumption will be briefly described below, although detailed description thereof will be provided in "BEST MODE FOR CARRYING OUT THE INVENTION" (in a first embodiment).

As stated above, it is difficult to completely remove hydrogen (H) from a p-type nitride semiconductor even with activation heat-treatment techniques. It has been understood that this residual hydrogen is bound, e.g., to magnesium (Mg) and that the location thereof is fixed unless heat treatment or the like is performed. However, the present inventors drew, from various experiments, the conclusion that residual hydrogen also moves when the nitride semiconductor light-emitting device is electrically driven. To be specific, a phenomenon presumably occurs in which numerous magnesium(Mg)-hydrogen(H) bonds are partially dissociated by heat energy, even at room temperature, or by optical excitation caused by laser light, and the dissociated hydrogen ions ($H^+$) migrate due to a bias voltage and current applied for driving the light-emitting device, and then bind to Mg again in the migration destination places. This phenomenon of the hydrogen ion movement caused by the electrical driving is the peculiar and new deterioration mechanism that occurs in nitride semiconductor light-emitting devices.

Means for Solving the Problem

In order to achieve the above object, a semiconductor light source and a light-emitting device drive circuit according to the invention are configured so as to perform not only forward drive operation but also reverse drive operation for a light-emitting device made of nitride semiconductors.

Specifically, a first inventive semiconductor light source includes: a semiconductor laser device including a plurality of semiconductor layers made of nitride semiconductors; and a drive circuit for driving the semiconductor laser device, wherein the drive circuit performs forward drive operation, in which a forward current is supplied to the semiconductor laser device to make the semiconductor laser device oscillate, and reverse drive operation, in which a reverse bias is applied to the semiconductor laser device; and a reverse drive period in which the reverse drive operation is performed is set within a laser-off period in which the forward drive operation is not performed.

In the first semiconductor light source, it is possible to return the hydrogen that has moved due to the normal forward drive operation to the original location by performing the reverse drive operation during the laser-off period in which the forward drive operation is not performed. Furthermore, the hydrogen movement is suppressed by switching back and forth between the forward drive operation and the reverse drive operation at high speed. This suppresses deterioration of the nitride semiconductor laser device caused by the hydrogen movement, thereby achieving a longer life.

In the first semiconductor light source, the magnitude of the reverse bias is preferably limited by the value of a reverse current flowing through the semiconductor laser device.

This prevents the reverse bias applied to the semiconductor laser device from having an excessively large value, thereby eliminating the possibility of deterioration or breakdown of the semiconductor laser device caused by the application of the reverse bias despite that intention.

In the first semiconductor light source, the plurality of semiconductor layers preferably include an active layer and a p-type cladding layer which contains hydrogen atoms.

According to findings obtained by the present inventors, the hydrogen contained in the p-type cladding layer moves closer to the active layer due to the forward drive operation to thereby decrease the carrier concentration in the p-type cladding layer located near the active layer, thus increasing in the amount of heat generation in the vicinity of the active layer. Moreover, an electron confinement effect at the interface between the active layer and the p-type cladding layer is decreased, leading to an increase in the amount of electron overflow. Deterioration of the nitride semiconductor laser device caused by such hydrogen movement is suppressed by performing the reverse driving according to the invention.

In this case, an overflow suppression layer for suppressing an overflow of carriers from the active layer is preferably provided between the active layer and the p-type cladding layer.

Furthermore, in this case, the p-type cladding layer and the overflow suppression layer are preferably doped with magnesium (Mg).

The overflow suppression layer is generally a layer for enhancing a carrier (electron) confinement effect, and when the hydrogen moves to the overflow suppression layer, the carrier concentration and hence the overflow suppression effect in the overflow suppression layer are decreased. For other p-type dopants, the phenomenon in which the activation rate thereof is decreased due to binding to hydrogen is also observed, however, the activation rate is decreased most significantly in the case of Mg. Hence, in a nitride semiconductor laser device including a p-type semiconductor doped with Mg, the hydrogen-movement-caused deterioration is suppressed more noticeably by performing the reverse driving.

The first semiconductor light source preferably further includes a light receiving device for receiving laser light emitted from the semiconductor laser device and reflected by an optical disk, wherein a switching cycle in which switching between the forward drive operation and the reverse drive operation is performed is preferably shorter than a cycle of a reproduction signal detected by the light receiving device in accordance with data recorded on the optical disk.

Then, in a case in which the first semiconductor light source is an optical pickup, switching between the forward drive operation and the reverse drive operation is performed at a high frequency. Specifically, the switching is performed in a cycle sufficiently shorter than a cycle of the reproduction signal from the optical disk, and the reproduction operation is performed at the average output thereof. This not only suppresses deterioration of the semiconductor laser device, but also produces the effect of reducing noise in the semiconductor laser device by the high frequency superimposition.

The first semiconductor light source preferably further includes a light receiving device for receiving laser light emitted from the semiconductor laser device and reflected by an optical disk, wherein switching between the forward drive operation and the reverse drive operation is preferably performed in accordance with data to be recorded on the optical disk, thereby recording the data on the optical disk.

In this way, in a case in which the first semiconductor light source is an optical pickup, in conventional recording operation, forward drive operation is performed intermittently but no reverse drive operation is performed. However, according to the invention, the reverse drive operation is performed during periods of time in which the forward drive operation is not performed, thereby suppressing deterioration of the semiconductor laser device. Since a semiconductor laser device is usually driven by higher output power (electrical power) during recording than during reproduction, the reverse drive operation performed during recording periods is more effective against deterioration.

The first semiconductor light source preferably further includes a light receiving device for receiving laser light emitted from the semiconductor laser device and reflected by an optical disk, wherein the reverse drive operation is preferably performed during a period of time other than a period of time in which data recorded on the optical disk is reproduced and other than a period of time in which other data is recorded on the optical disk.

In this manner, in a case in which the first semiconductor light source is an optical pickup, the reverse driving is performed during periods of time in which the optical pickup does not perform reproduction operation and recording operation. When the optical pickup is used in a common way, periods of time in which reproduction and recording are performed are limited, and thus if the reverse drive operation is performed during periods of times other than these reproduction and recording periods, it is possible to have enough time to recover the movement of the hydrogen.

The first semiconductor light source preferably further includes a heater for heating the semiconductor laser device, wherein a heat period in which the semiconductor laser device is heated by the heater is preferably set within the laser-off period; and the heat period and the reverse drive period preferably coincide with each other.

If excitation caused by laser light contributes to dissociation between magnesium and hydrogen, dissociation between magnesium and hydrogen is not likely to occur during the reverse drive operation in which no laser light is present. To compensate for this, if the semiconductor laser device is heated during the reverse drive operation, the dissociation caused by the heat energy is promoted, thereby enhancing reverse movement of the hydrogen.

The first semiconductor light source preferably further includes fluorescent material, which is excited by laser light emitted from the semiconductor laser device, wherein a switching frequency at which switching between the forward drive operation and the reverse drive operation is performed is preferably equal to or higher than a frequency of a commercial power supply.

In this manner, in a case in which the first semiconductor light source is a solid-state lighting system, if switching between the forward drive operation and the reverse drive operation is performed at a frequency equal to or higher than the frequency of the commercial power supply, lighting operation is performed at the average output. Therefore, if the drive-operation switching frequency is set to the frequency of the commercial power supply, flicker during the lighting operation is as small as that in fluorescent lamps. Alternatively, if the switching is performed at a frequency sufficiently higher than the commercial power supply frequency, non-flickering lighting operation is achievable.

The first semiconductor light source preferably further includes fluorescent material, which is excited by laser light emitted from the semiconductor laser device, wherein the reverse drive operation is preferably performed during a period of time other than a period of time in which light emitted from the fluorescent material is used.

In this manner, in a case in which the first semiconductor light source is a solid-state lighting system, the reverse driving is performed during periods of time in which the lighting system is off. For example, a typical light is often off during the daytime, and therefore if the reverse drive operation is performed while the light is off, it is possible to have enough time to recover the hydrogen movement.

A first inventive light-emitting device drive circuit for driving a semiconductor laser device including a plurality of semiconductor layers made of nitride semiconductors includes: a forward drive circuit for supplying a forward current to the semiconductor laser device to make the semiconductor laser device oscillate; a reverse drive circuit for applying a reverse bias to the semiconductor laser device; and a switching circuit for performing switching between the forward drive circuit and the reverse drive circuit, thereby connecting either the forward drive circuit or the reverse drive circuit with the semiconductor laser device.

The first light-emitting device drive circuit is the drive circuit included in the inventive semiconductor light source. When used in combination with a semiconductor laser device, the light-emitting device drive circuit produces the functions and effects of the invention. Therefore, the drive circuit by itself is also available as a product.

A second inventive semiconductor light source includes: a light-emitting device including a plurality of semiconductor layers made of nitride semiconductors; and a drive circuit for driving the light-emitting device, wherein the drive circuit performs forward drive operation, in which a forward current is supplied to the light-emitting device to make the light-emitting device emit light, and reverse drive operation, in which a reverse bias is applied to the light-emitting device; and the magnitude of the reverse bias is limited by the value of a reverse current flowing through the light-emitting device.

In the second semiconductor light source, the light-emitting device made of nitride semiconductors is not limited to a semiconductor laser device, but may be a light-emitting diode, even in which case it is possible to return the hydrogen that has moved due to the normal forward drive operation to the original location by performing the reverse drive operation. This suppresses deterioration of the light-emitting device made of nitride semiconductors caused by the hydrogen movement, thereby achieving a longer life.

An invention is disclosed in Patent Document 4, for example, which has no relation to the functions and effects of this invention, but in which nitride semiconductor light-emitting diodes are connected in series, and a 100-V or 120-V commercial AC power supply is directly applied to both terminals thereof, that is, both terminals thereof are directly connected with a lamp line. The invention in Patent Document 4 aims to achieve an inexpensive semiconductor lighting system, and the configuration according to that invention results in application of a reverse voltage to the nitride semiconductor light-emitting diodes. However, the invention in Patent Document 4 does not disclose the technical principle that deterioration or breakdown of the light-emitting diodes is prevented by limiting the magnitude of the reverse bias by the value of a reverse current flowing through the light-emitting devices, and, thus in this respect, differs from this invention.

A second inventive light-emitting device drive circuit for driving a light-emitting device including a plurality of semiconductor layers made of nitride semiconductors includes: a forward drive circuit for supplying a forward current to the light-emitting device to make the light-emitting device emit light; a reverse drive circuit for applying a reverse bias to the light-emitting device; and a constant current circuit for limiting the value of a reverse current flowing though the light-emitting device.

The second light-emitting device drive circuit is the drive circuit included in the second semiconductor light source. When used in combination with a light-emitting device including a light-emitting diode, the light-emitting device drive circuit produces the functions and effects of the invention. Therefore, the drive circuit by itself is also available as a product.

Effects of the Invention

In the semiconductor light sources and the light-emitting device drive circuits according to the invention, a deterioration mechanism peculiar to nitride semiconductor light-emitting devices is suppressed, thereby enabling the nitride semiconductor light-emitting devices to have a longer life. To be specific, deterioration of the nitride semiconductor light-emitting devices caused by movement of hydrogen is suppressed to achieve a longer life.

BRIEF DESCRIPTION OF DRAWINGS

FIGS. 4A to 4C are schematic cross-sectional views for explaining a deterioration mechanism in the semiconductor laser device used in the semiconductor light source according to the first embodiment of the invention.

FIGS. 5A and 5B are energy band diagrams of the semiconductor laser device used in the semiconductor light source according to the first embodiment of the invention.

EXPLANATION OF THE REFERENCE CHARACTERS

Figure 1:
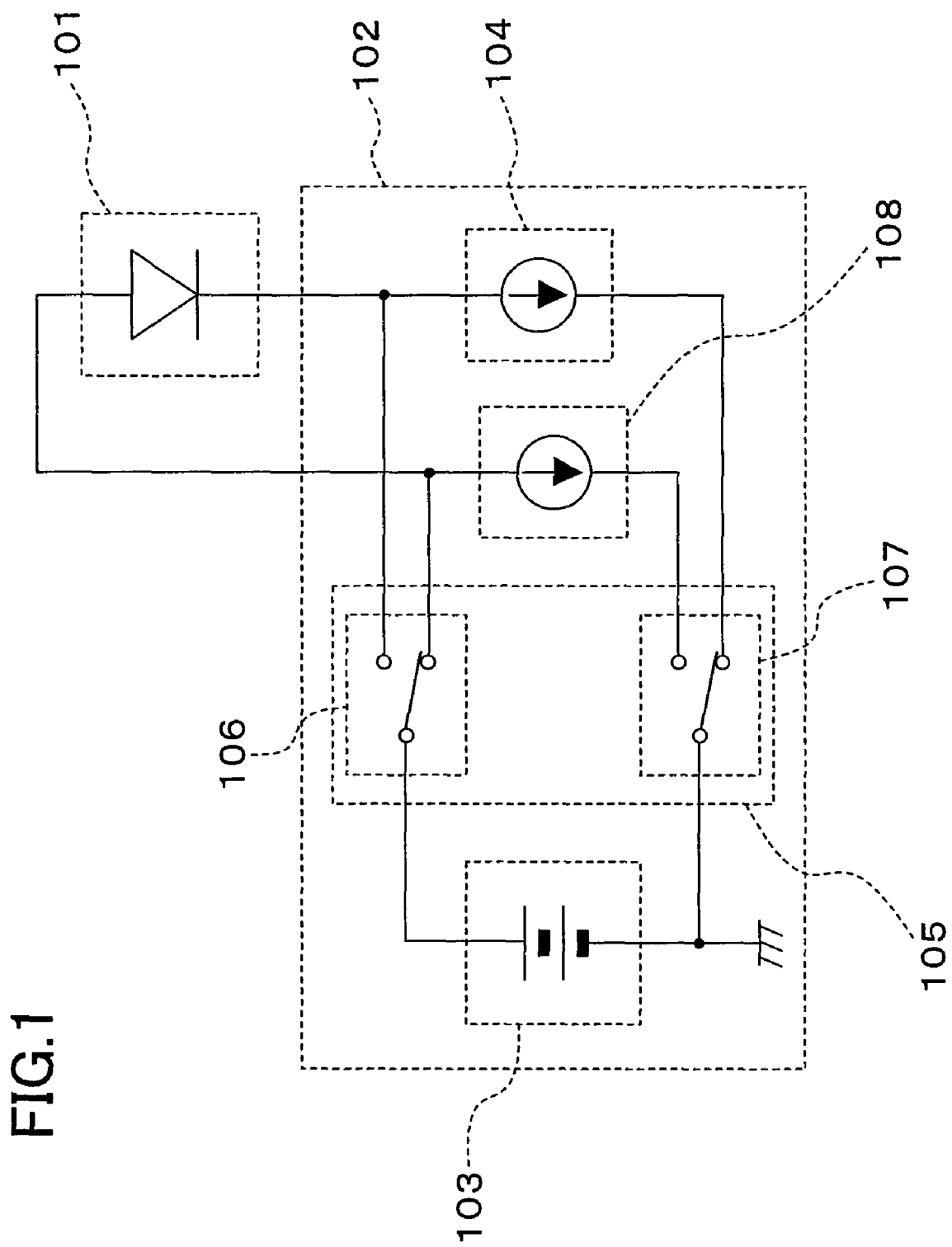
FIG. 1 is a block diagram illustrating the configuration of a semiconductor light source according to a first embodiment of the invention.

101 Semiconductor laser device
102 Drive circuit
103 Direct-current voltage source
104 First constant current circuit
105 Pair of interlock switches
106 First switch
107 Second switch
108 Second constant current circuit
201 Semiconductor laser chip
202 Substrate
203 N-type cladding layer
204 First guide layer
205 Multi-quantum well active layer
206 Second guide layer
207 Overflow suppression layer
208 P-type cladding layer
209 Contact layer
210 Insulating film
211 P-side electrode
212 N-side electrode
401 Overflow suppression layer
402 P-type cladding layer
403 Contact layer
404 P-side electrode
405 Hydrogen
406 Magnesium (bound to hydrogen)
407 Magnesium
408 Hydrogen ion
501 Well layer
502 Barrier layer
503 Multi-quantum well active layer
504 Second guide layer
505 Overflow suppression layer
506 P-type cladding layer
507 Electron
508 Hole
601 Optical pickup
602 Laser hologram unit
603 Semiconductor laser device
604 Light receiving device
605 Hologram element
606 Laser light
607 Setup mirror
608 Objective lens
609 Optical disk
610 Reflected light
611 Thin-film resistance heater 701 Reproduction period
702 Recording period
703 Idling period
801 Semiconductor laser device
802 Forward drive transistor
803 First constant current circuit
804 First current control terminal
805 First switching transistor
806 Second switching transistor
807 First switch control terminal
808 First bias resistor
809 Second bias resistor
810 Reverse drive transistor
811 Second constant current circuit
812 Second current control terminal
813 Third switching transistor
814 Fourth switching transistor
815 Second switch control terminal
816 Third bias resistor
817 Fourth bias resistor
818 Power terminal
901 Base
902 Semiconductor laser device
903 Ultraviolet laser light
904 Diffuse reflector plate
905 Ultraviolet scattered light
906 Fluorescent material
907 Visible light
908 Bonding wire
909 First wire metal
910 Second wire metal
911 Drive circuit
912 Plastic encapsulant material
1001 White light emitting diode
1002 First light-emitting diode unit
1003 Second light-emitting diode unit
1004 AC power supply
1005 First rectifier diode
1006 First constant current diode
1007 Second rectifier diode
1008 Second constant current diode
1009 Drive circuit
1010 Third rectifier diode
1011 Third constant current diode
1012 Fourth rectifier diode
1013 Fourth constant current diode
1014 Second drive circuit

BEST MODE FOR CARRYING OUT THE INVENTION

First Embodiment

A first embodiment of the invention will be described with reference to the accompanying drawings.

FIG. 1 shows a block configuration of a semiconductor light source according to the first embodiment of the invention. Circuit symbols shown in FIG. 1 are used to clarify the roles of the functional blocks surrounded by broken lines.

As shown in FIG. 1, the semiconductor light source according to the first embodiment includes a semiconductor laser device 101 having a plurality of semiconductor layers made of nitride semiconductors, and a drive circuit 102 for electrically driving the semiconductor laser device 101.

The drive circuit 102 includes: a direct-current voltage source 103 whose negative electrode is grounded; a first constant current circuit 104 whose one terminal is connected with the negative electrode (the n-side electrode) of the semiconductor laser device 101 and with a pair of interlock switches 105; and a second constant current circuit 108 whose one terminal is connected with the positive electrode (the p-side electrode) of the semiconductor laser device 101 and with the pair of interlock switches 105.

The pair of interlock switches 105 includes a first switch 106, which performs switching for connecting the positive electrode of the direct-current voltage source 103 with the negative or positive electrode of the semiconductor laser device 101, and a second switch 107, which performs switching for connecting the negative electrode of the direct-current voltage source 103 with the other terminal of the first or second constant current circuit 104 or 108. In the connected state shown in FIG. 1, a forward connection is established with respect to the semiconductor laser device 101, and if the pair of interlock switches 105 is connected in the opposite manner, then a reverse connection is established with respect to the semiconductor laser device 101.

During the periods of time in which the pair of interlock switches 105 is connected in the forward direction, a forward current regulated by the first constant current circuit 104 flows through the semiconductor laser device 101, so that a forward drive operation is performed in which the semiconductor laser device 101 performs laser oscillation. On the other hand, during the periods of time in which the pair of interlock switches 105 is connected in the reverse direction, a reverse drive operation is performed in which a reverse bias is applied to the semiconductor laser device 101. The reverse drive operation may be a constant voltage operation in which a reverse voltage applied to the semiconductor laser device 101 is constant, or a constant current operation in which a reverse current is constant. In this embodiment, current-limiting voltage driving is preferably performed in which the maximum current value is limited by the second constant current circuit 108 and the voltage of the direct-current voltage source 103 is the maximum applied voltage. This prevents the reverse voltage applied to the semiconductor laser device 101 from becoming excessively large, thereby eliminating the possibility of deterioration or breakdown of the semiconductor laser device 101 caused by the application of the reverse voltage.

Other than the forward drive operation and the reverse drive operation, a state, in which the pair of interlock switches 105 is not connected to either point, or a complete off-state, in which the direct-current voltage source 103 is in the off state and no bias is applied to the semiconductor laser device 101, may be established.

Figure 2:
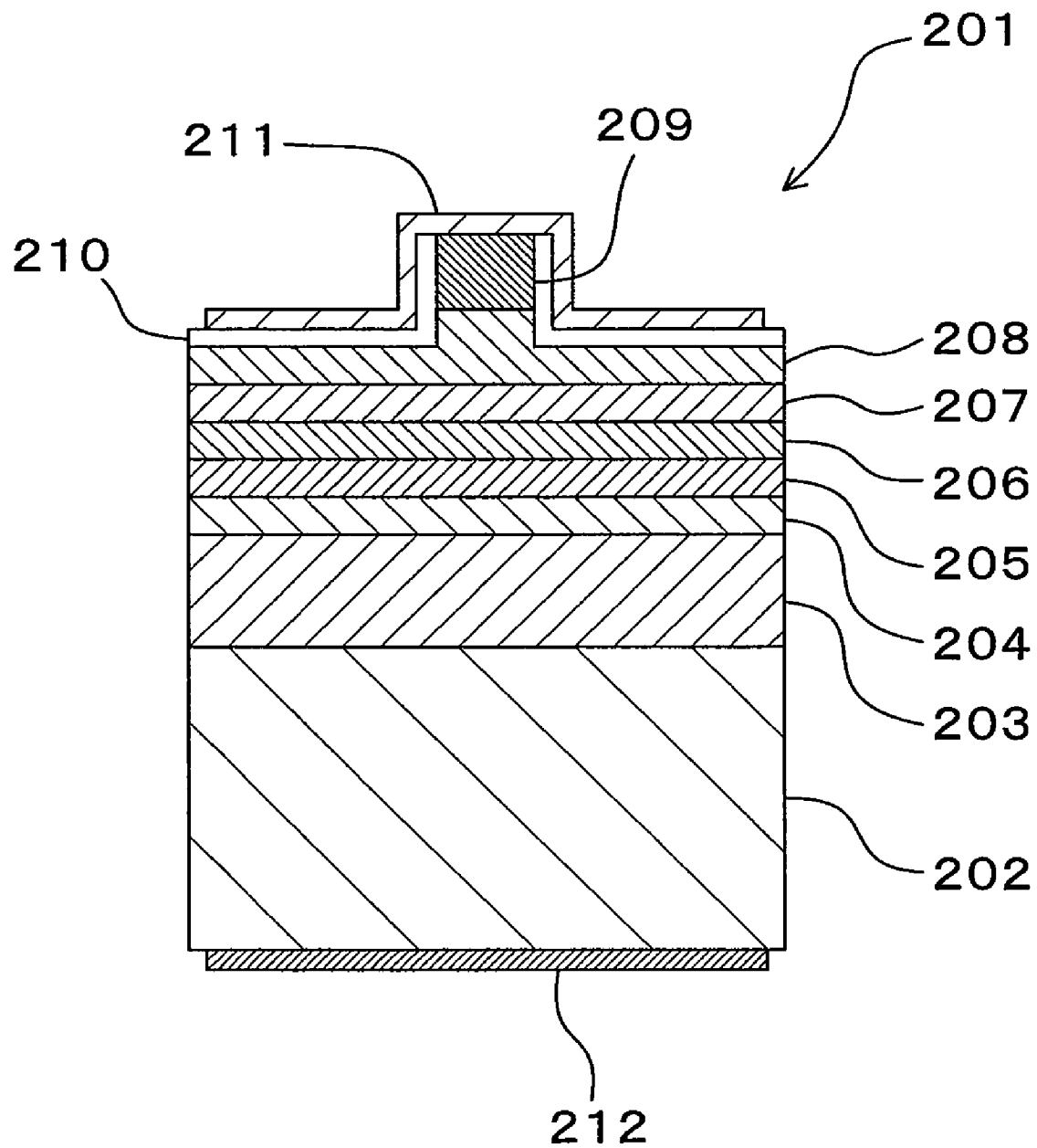
FIG. 2 is a cross-sectional view illustrating the configuration of a semiconductor laser chip used in the semiconductor light source according to the first embodiment of the invention.

FIG. 2 shows an example of a cross-sectional configuration of a semiconductor laser chip 201 included in the semiconductor laser device 101.

As shown in FIG. 2, an n-type cladding layer 203 made of $Al_{0.05}Ga_{0.95}N$ doped with Si (having a thickness of 1 μm and a carrier concentration of $5\times10^{17}$ cm$^{-3}$), a first guide layer 204 made of GaN doped with Si (having a thickness of 100 mm and a carrier concentration of $5\times10^{17}$ cm$^{3}$), a multi-quantum well active layer 205 composed of well layers (having a thickness of 3 nm) made of non-doped $Ga_{0.92}In_{0.08}N$ and barrier layers (having a thickness of 8 nm) made of non-doped $Ga_{0.98}In_{0.02}N$, a second guide layer 206 made of non-doped GaN (having a thickness of 100 nm), an overflow suppression layer 207 made of $Al_{0.15}Ga_{0.85}N$ doped with Mg (having a thickness of 10 nm and a carrier concentration of $1\times10^{19}$ cm$^{-3}$), a p-type cladding layer 208 made of an $Al_{0.1}Ga_{0.9}N$/GaN superlattice doped with Mg (having a thickness of 500 nm), and a contact layer 209 made of GaN doped with Mg (having a thickness of 60 nm and a carrier concentration of $1 \times 10^{20}$ cm$^{-3}$) are stacked in this order on a substrate 202 made of n-type GAN, for example, thereby forming a laser structure.

The contact layer 209 and the p-type cladding layer 208 are patterned by etching so as to have a striped ridge structure extending in directions coming out of and into the drawing. An insulating film 210 made of tantalum oxide (Ta$_2$O$_5$) is formed on both sides of and alongside the ridge structure in such a manner as to expose the upper surface of the ridge structure. A p-side electrode 211 composed of a multilayer film of palladium (Pd)/platinum (Pt) is formed so as to cover the exposed upper surface of the ridge structure and the insulating film 210. The p-side electrode 211 is thus in contact with the contact layer 209 on the upper surface of the ridge structure. On the surface of the substrate 202 which is opposite the n-type cladding layer 203, an n-side electrode 212 composed of a multilayer film of titanium (Ti)/platinum (Pt)/gold (Au) is formed.

The semiconductor laser chip 201 having the above structure is mounted on a predetermined package (not shown), thereby forming the semiconductor laser device 101 shown in FIG. 1.

In order to drive the semiconductor laser device 101 with the circuit configuration shown in FIG. 1, the package mounting must be performed in such a manner that each of the p-side electrode 211 and the n-side electrode 212 of the semiconductor laser chip 201 is not grounded with the package body (stem). To that end, a submount material made, e.g., of diamond (C), boron nitride (BN), or other insulator having excellent heat dissipation characteristics is used. If metal films are formed only on the upper and lower surfaces of the submount material, the metal films formed on the submount material are both insulated. Therefore, if the semiconductor laser chip 201 is die-bonded on the submount material having the metal films formed only on the upper and lower surfaces thereof, and thereafter the p-side electrode 211 and the n-side electrode 212 are each wire-bonded directly or through the metal film formed on the upper surface of the submount material to leads of the package, the semiconductor laser chip 201 is mounted in such a manner that neither the p-side electrode 211 nor the n-side electrode 212 is grounded with the package body (stem).

Figure 3B:
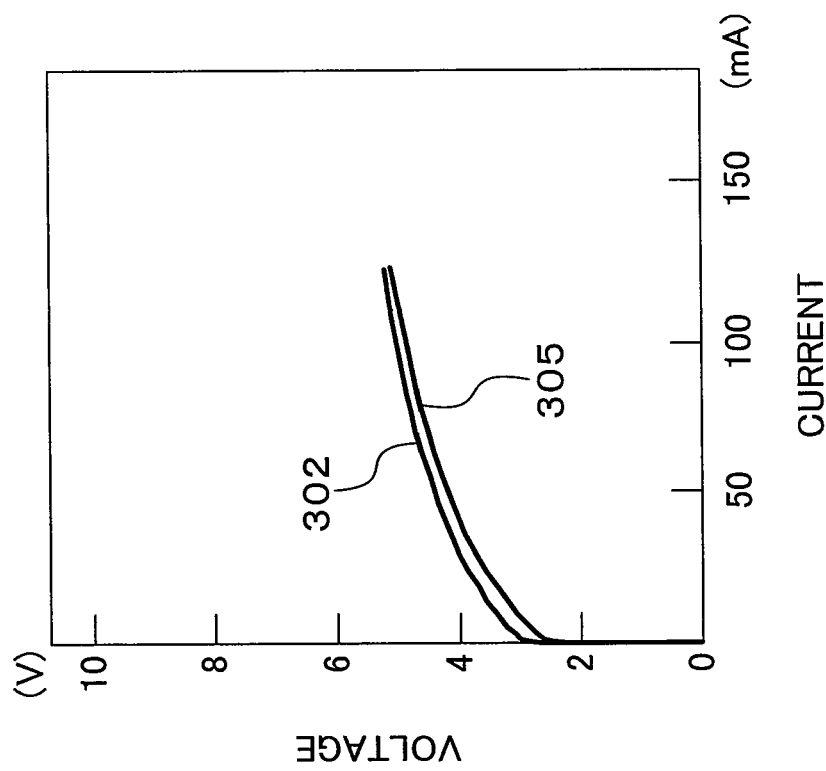
FIGS. 3A and 3B are diagrams showing the operation characteristics of a semiconductor laser device used in the semiconductor light source according to the first embodiment of the invention.
Figure 3A:
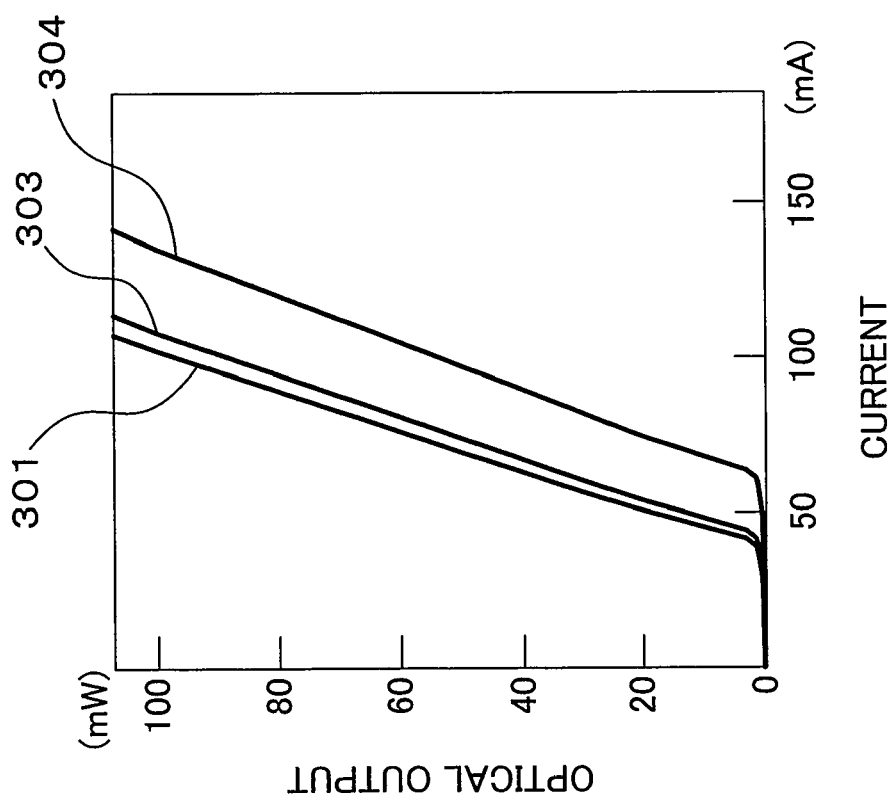

FIGS. 3A and 3B show changes in the operation characteristics of the semiconductor laser device 101 in the semiconductor light source of the first embodiment, when the forward drive operation and the reverse drive operation according to the invention were alternately performed while switching back and forth between these operations in the semiconductor light source, and when the forward drive operation was only performed in the semiconductor light source as is conventional. FIG. 3A shows the current-optical output characteristics, while FIG. 3B shows the current-voltage characteristics. In FIGS. 3A and 3B, the initial characteristics before aging are indicated by initial optical characteristics 301 and by initial voltage characteristics 302, respectively. Then, the aging process was performed on these initial characteristics under the following two conditions. Under the first condition according to the invention, aging of a total of 1000 hours was performed by repeating a step in which a one-hour forward drive operation was performed at room temperature at an optical output of 100 mW and then a one-hour reverse drive operation was performed by constant current driving by a reverse current with a maximum applied voltage of 10 V and a current value of 10 µA. Under the second condition, which was a comparison example, aging of a total of 1000 hours was performed by repeating a step in which a one-hour forward drive operation was performed at room temperature at an optical output of 100 mW and then the semiconductor light source was left standing for an hour without applying a reverse bias.

As shown in FIG. 3A, in the case of the aging under the first condition, the current-optical output characteristics changed to first optical characteristics 303, and the threshold current increased slightly. On the other hand, in the case of the aging under the second condition, the current-optical output characteristics changed to second optical characteristics 304, and the threshold current increased greatly.

Also, as shown in FIG. 3B, even after the aging performed under the first condition, the current-voltage characteristics changed little from the initial voltage characteristics 302. The aging under the second condition, on the other hand, resulted in second voltage characteristics 305, in which the rising voltage was lowered slightly.

From these results, it is found that, as in the first embodiment, when the driving is performed by repeating the forward drive operation and the reverse drive operation while switching back and forth between these operations, deterioration of the semiconductor laser device is suppressed as compared with the case in which only the forward drive operation is performed intermittently, thereby achieving a longer life.

The reason why the above effect is produced by performing the forward drive operation and then the reverse drive operation as shown in the first embodiment is presumably that deterioration caused by movement of hydrogen (H) contained in the p-type nitride semiconductor layer in the semiconductor laser device 101 is suppressed.

The phenomenon of the suppression of the deterioration caused by the hydrogen movement will be explained below with reference to FIGS. 4A to 4C and FIGS. 5A and 5B.

First, referring to FIGS. 4A to 4C, the mechanism behind deterioration of a p-type nitride semiconductor layer due to the movement of hydrogen (H) will be described. FIGS. 4A to 4C schematically illustrate an overflow suppression layer 401, a p-type cladding layer 402, a contact layer 403, and a p-side electrode 404 in a semiconductor laser chip, and magnesium (Mg) and hydrogen (H) contained in each semiconductor layer. In FIG. 4A, small solid circles 405 represent hydrogen, while large open circles 406 indicate magnesium bound to hydrogen. Large circles 407 with hatched lines represent magnesium not bound to hydrogen. As explained in "BACKGROUND ART", the magnesium that is not bound to hydrogen is activated to provide carriers (electron holes), whereas the magnesium bound to the hydrogen is inactive and thus does not provide carriers.

Next, FIG. 4B shows a state in which numerous magnesium-hydrogen bonds are partially dissociated by heat energy, even at room temperature, or by optical excitation caused by laser light, etc., thereby producing the dissociated hydrogen ions (H$^+$) indicated by small open circles 408. The magnesium from which hydrogen has been dissociated is activated to become the large circles 407 with hatched lines. When the semiconductor laser device is driven in the forward direction, a positive bias voltage is applied to the p-side electrode 404, causing the dissociated hydrogen ions to migrate from the contact layer 403 toward the overflow suppression layer 401, and the dissociated hydrogen ions bind to other magnesium again in the migration destination places. FIG. 4C shows this state.

As is clear from a comparison between FIGS. 4A and 4C, the forward driving reduces the hydrogen in the contact layer 403 while increasing the hydrogen in the overflow suppression layer 401. That is, the carrier concentration in the contact layer 403 is increased, whereas the carrier concentration in the overflow suppression layer 401 is lowered.

As the carrier concentration in the overflow suppression layer 401 is lowered, the optical output characteristics of the semiconductor laser device deteriorate through a mechanism shown in FIGS. 5A and 5B. FIGS. 5A and 5B are energy band diagrams of a semiconductor laser chip, in which a multi-quantum well active layer 503 composed of well layers 501 and barrier layers 502, a second guide layer 504, an overflow suppression layer 505, and a p-type cladding layer 506 are illustrated. The p-type cladding layer 506 is actually an $Al_{0.1}Ga_{0.9}N/GaN$ superlattice. However, for the sake of simplicity and since this simplification does not affect the description in this embodiment, it is assumed that the p-type cladding layer 506 has an average composition of $Al_{0.05}Ga_{0.95}N$. FIG. 5A shows the initial state in which the carrier concentration in the overflow suppression layer 505 is high, while FIG. 5B shows a state in which the carrier concentration in the overflow suppression layer 505 is lowered by movement of hydrogen.

As shown in FIG. 5A, in forward driving, electrons 507 and holes 508 are accumulated in the active layer 503, and the overflow suppression layer 505 functions as a layer for suppressing an overflow of the electrons 507 as the name thereof implies. However, in the state shown in FIG. 5B, in which the carrier concentration in the overflow suppression layer 505 is lowered by the movement of hydrogen, the overflow suppression effect thereof decreases, resulting in an increase in the amount of overflow of the electrons. This means that unavailable current that does not contribute to light emission is increased to thereby decrease the internal quantum efficiency in the active layer 503.

To summarize the description provided with reference to FIGS. 4 and 5, when the nitride semiconductor laser device is aged by the forward driving, the hydrogen in the p-type nitride semiconductor layer moves, thereby lowering the carrier concentration in the overflow suppression layer. As a result, the internal quantum efficiency in the active layer decreases.

Even in a case where the semiconductor laser chip does not include the overflow suppression layer 505, if the carrier concentration in part of the p-type cladding layer 506 in the vicinity of the second guide layer 504 is lowered by the movement of hydrogen, the amount of overflow of electrons is increased, and hence the phenomenon in which unavailable current that does not contribute to light emission is increased occurs. In other words, the phenomenon in which the internal quantum efficiency in the active layer 503 decreases due to the movement of hydrogen occurs more noticeably in the case where the overflow suppression layer 505 is provided, but may also occur even if the overflow suppression layer 505 is not provided. Furthermore, regardless of the presence or absence of the overflow suppression layer 505, if the carrier concentration in the p-type semiconductor layer located in the vicinity of the active layer 503 is decreased, the resistance value of that p-type semiconductor layer is increased, causing the amount of heat generation to be increased locally. This phenomenon, too, causes the internal quantum efficiency in the active layer 503 to decrease.

The description provided with reference to FIGS. 4 and 5 agrees quite well with the results of the aging performed under the second condition shown in FIG. 3. Specifically, when the forward drive operation is only performed, the internal quantum efficiency in the active layer is eventually decreased by the movement of hydrogen, thereby increasing the threshold current. The description provided with reference to FIGS. 4 and 5 also agrees with the experimental result that a decrease in the carrier concentration in the overflow suppression layer due to the movement of hydrogen causes an increase in the amount of electron overflow, thereby slightly lowering the rising voltage. In contrast, when the forward drive operation and the reverse drive operation are alternately performed while switching back and forth between these operations as in the invention, the movement of hydrogen occurring through the mechanism shown in FIG. 4 becomes reciprocal and two-way and is thus suppressed substantially. Hence, an increase in threshold current and a decrease in rising voltage become smaller as compared with the case where only the forward drive operation is performed.

Second Embodiment

Hereinafter, a second embodiment of the invention will be described with reference to the accompanying drawings.

Figure 6:
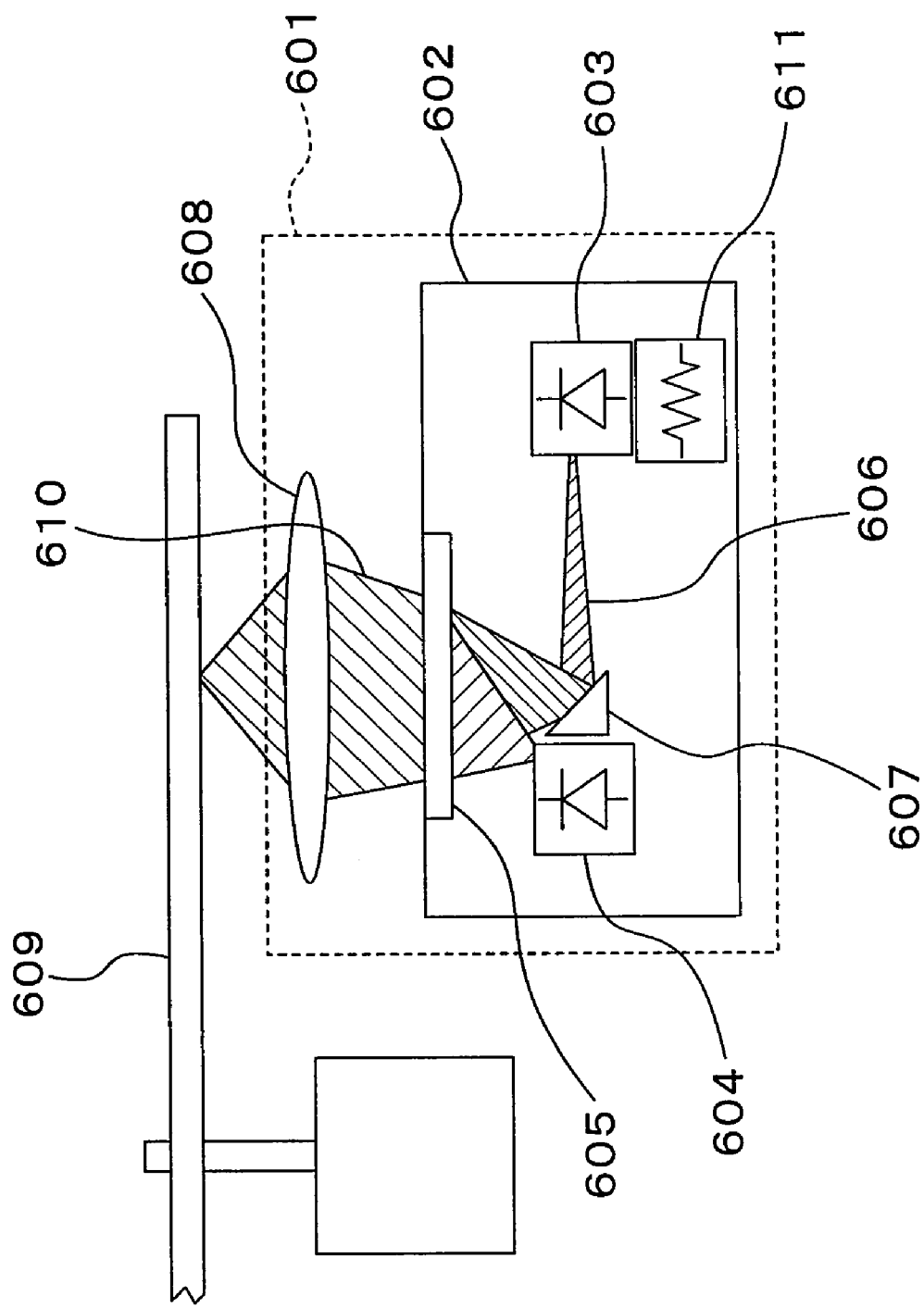
FIG. 6 is a conceptual view illustrating the configuration of a semiconductor light source according to a second embodiment of the invention.

FIG. 6 conceptually illustrates the configuration of an optical pickup according to the second embodiment of the invention. As shown in FIG. 6, the optical pickup 601 according to the second embodiment includes a laser hologram unit 602 which is a semiconductor light source according to the invention.

The laser hologram unit 602 includes: a semiconductor laser device 603 having therein the semiconductor laser chip 201 shown in FIG. 2, for example; a light receiving device 604; a hologram element 605; and a thin-film resistance heater 611 provided in the vicinity of the semiconductor laser device 603.

Laser light 606 emitted from the semiconductor laser device 603 in a horizontal direction (a direction parallel with respect to the hologram element 605) is changed in direction by a setup mirror 607 so as to be perpendicular with respect to the hologram element 605 and pass through the hologram element 605. The laser light 606, after passing through the hologram element 605, is condensed on an optical disk 609 by an objective lens 608. Then, light 610 reflected by the optical disk 609 is diffracted by the hologram element 605, and the diffracted light is received by the light receiving device 604. In this embodiment, the semiconductor laser device 603 is driven by a drive circuit (not shown in FIG. 6) which will be described next with reference to FIGS. 7 and 8.

The thin-film resistance heater 611 for heating the semiconductor laser device 603 is used when reverse drive operation is performed in a predetermined operation mode.

FIGS. 7A to 7D are operation diagrams of the drive circuit, which show changes with time in drive current flowing in the semiconductor laser device 603.

Figure 7A:
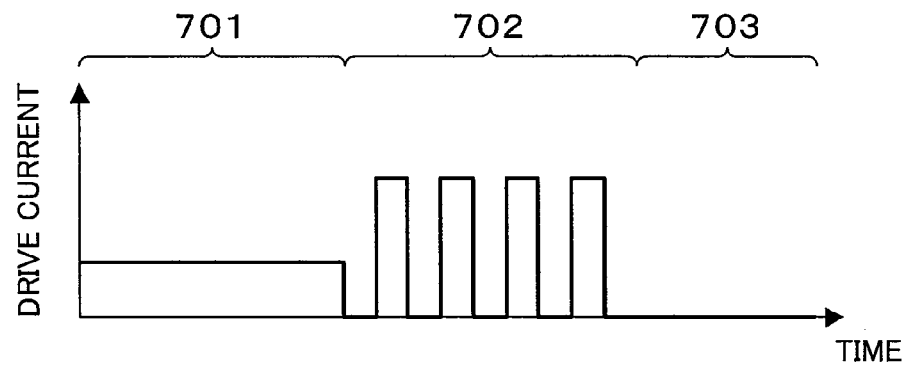
FIGS. 7A to 7D are operation diagrams for explaining operation of a drive circuit used in the semiconductor light source according to the second embodiment of the invention.

For comparison purposes, FIG. 7A shows a conventional driving method, in which the semiconductor laser device 603 is driven by a direct current of 30 mA, for example, during a reproduction period 701. During this period, the semiconductor laser device 603 emits the laser light 606 having constant power (electric power), and the light receiving device 604 detects a reproduction signal corresponding to data recorded on the optical disk 609.

During a recording period 702, the semiconductor laser device 603 is driven by a pulse current having a peak value of 100 mA, for example, and predetermined data is recorded on the optical disk 609 by the laser light 606 modulated by the pulse current. And during an idling period 703, neither reproduction nor recording is performed, and hence no drive current is supplied.

Figure 7B:
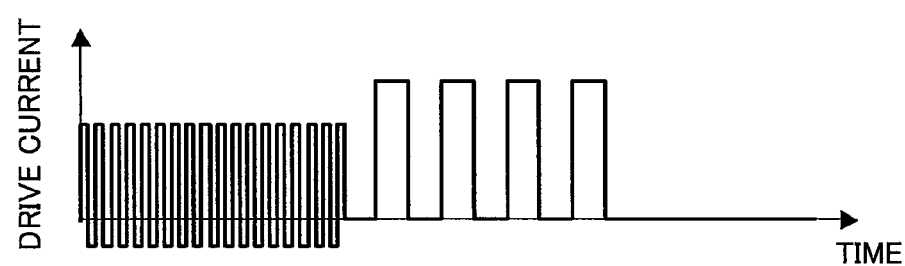
Figure 7C:
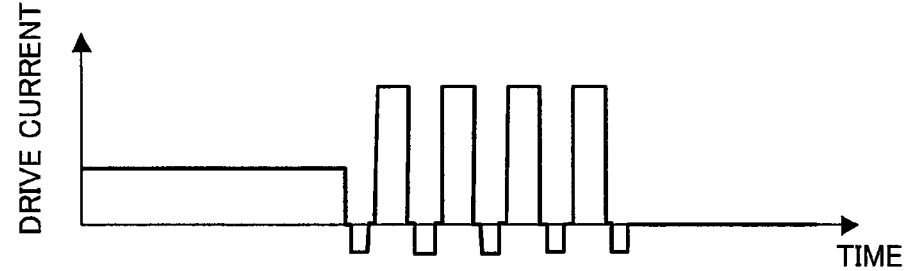
Figure 7D:
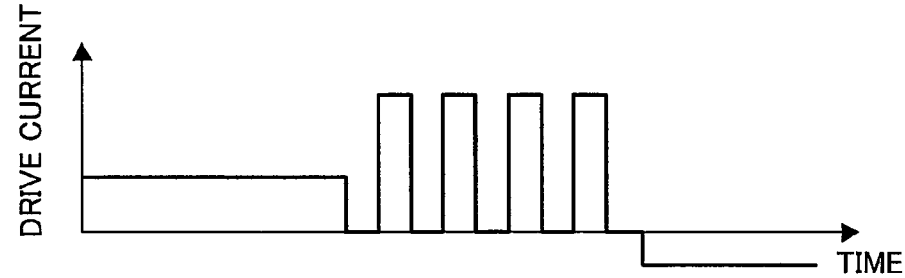

In contrast to the conventional driving method shown in FIG. 7A, three methods shown in FIGS. 7B to 7D may be performed when the reverse drive operation according to the invention is adopted.

First, in the first driving method shown in FIG. 7B, during the reproduction period 701, the semiconductor laser device 603 is driven by pulse driving instead of the dc driving. During this pulse driving, the forward drive operation and the reverse drive operation are repeated alternately. In this case, the current value at the time of the forward drive operation is set in such a manner that the average power of the laser light 606 is equal to the average power obtained when the dc driving is performed. Also, in the reverse drive operation, the driving is performed with a maximum applied voltage of 10 V and a maximum reverse current of 10 μA, for example. The cycle in which the forward drive operation and the reverse drive operation are repeated is made sufficiently shorter than a cycle of the reproduction signal detected by the light receiving device 604. Such driving of the semiconductor laser device 603 by a high-frequency pulse during the reproduction period is the same as high-frequency superimposition processing for reducing noise in the semiconductor laser device 603. That is, if the forward drive operation and the reverse drive operation are repeated in a short cycle during the reproduction period, not only deterioration of the semiconductor laser device 603 is suppressed, but also a noise-reducing effect is achievable by the high frequency superimposition.

Next, in the second driving method shown in FIG. 7C, the output of the semiconductor laser device 603 is turned on or off during the recording period 702 in accordance with data (a binary signal "0" or "1") recorded on the optical disk even in the case of the conventional driving method. During this pulse driving, if a reverse bias is applied in addition to making the current zero when the output of the semiconductor laser device 603 is in the off state, the functions and effects of the invention are obtainable. In this embodiment, in the reverse bias, the maximum applied voltage is 10 V and the maximum reverse current is 10 uA, for example. This enables the forward drive operation and the reverse drive operation to be alternately performed during the recording period while switching back and forth between these operations. Since the semiconductor laser device 603 is usually driven by higher output power during recording than during reproduction, the reverse drive operation performed during the recording period is more effective against deterioration. In the pulse-driving of the semiconductor laser device 603, if switching is directly performed between the forward drive operation and the reverse drive operation, an excessive overshoot may occur in the drive current waveform. To prevent this, it is effective to provide pause periods in which the bias is temporarily made zero as shown in FIG. 7C instead of performing the direct switching between the forward drive operation and the reverse drive operation.

When the reverse drive operation is performed during the reproduction period 701 or during the recording period 702, switching between the forward drive operation and the reverse drive operation is performed in a short cycle. Thus if the thin-film resistance heater 611 shown in FIG. 6 is used, the semiconductor laser device 603 will be heated during the forward drive operation as well. Since the oscillation characteristics of the semiconductor laser device 603 usually deteriorate with increasing temperature, it is not preferable to heat the semiconductor laser device 603 during the forward drive operation. Nevertheless, if the deterioration suppression effect (the moved-hydrogen recovering effect) produced by the heating is more important, the semiconductor laser device 603 may be heated by the thin-film resistance heater 611.

Next, in the third driving method shown in FIG. 7D, the reverse drive operation is performed during the idling period 703. When the optical pickup 601 is used in a common way, the periods of time in which reproduction and recording are performed are limited, and thus if the reverse drive operation is performed during periods of time other than those reproduction and recording periods, it is possible to have enough time to recover the hydrogen that has moved. Furthermore, with the use of the thin-film resistance heater 611, the third driving method becomes more effective. If the excitation caused by the laser light contributes to the dissociation between magnesium (Mg) and hydrogen (H), the dissociation between Mg and H is not likely to occur in a case where the reverse drive operation is continuously performed for a long time, because no laser light is produced in that case. To compensate for this, if the semiconductor laser device 603 is heated by the thin-film resistance heater 611 during the reverse drive operation, the dissociation between Mg and H caused by the heat energy is promoted, thereby enhancing reverse movement of the hydrogen.

Although in the foregoing the three driving methods for performing the reverse drive operation for the semiconductor laser device 603 used in the optical pickup 601 have been described, any two of the three driving methods may be combined. Alternatively, if all of the three driving methods are performed, deterioration of the semiconductor laser device 603 is suppressed more effectively.

Figure 8:
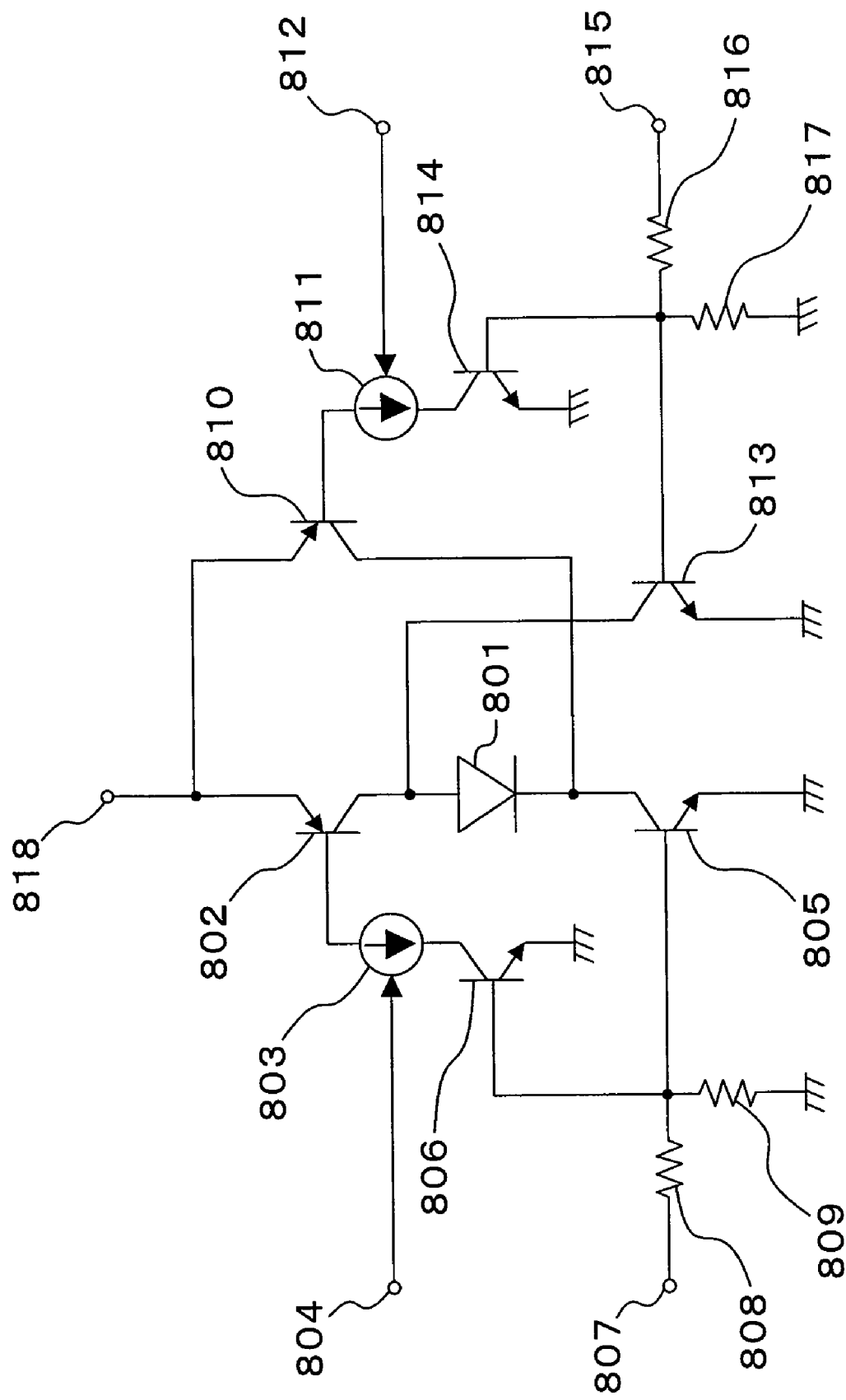
FIG. 8 is a circuit diagram illustrating the drive circuit used in the semiconductor light source according to the second embodiment of the invention.

When the reverse drive operation is performed during the reproduction period 701 or during the recording period 702, it is necessary to switch between the forward drive operation and the reverse drive operation in a short cycle. FIG. 8 shows a drive circuit suitable for this.

As shown in FIG. 8, a pnp forward drive transistor 802 supplies a bias current to a semiconductor laser device 801 during forward drive operation. Collector current in the forward drive transistor 802 is controlled by a first constant current circuit 803, and the current value of the first constant current circuit 803 is controlled by a signal from a first current control terminal 804. Although not shown in FIG. 8, in practice, output optical power from the semiconductor laser device 801 is monitored (detected), and a signal from an automatic power control (APC) circuit, which performs control so that this output optical power has a predetermined value, is input to the first current control terminal 804.

A first npn switching transistor 805 and a second npn switching transistor 806 control whether or not the forward drive transistor 802 supplies the bias current to the semiconductor laser device 801. Base current in the first switching transistor 805 and in the second switching transistor 806 is controlled by division of a voltage applied to a first switch control terminal 807 by a first bias resistor 808 and a second bias resistor 809.

A circuit having the same configuration as the above-described forward drive circuit is connected to the p- and n-side electrodes of the semiconductor laser device 801 in the opposite direction, thereby forming a reverse drive circuit. That is, a reverse bias current is applied to the semiconductor laser device 801 by a reverse drive transistor 810. Collector current in the reverse drive transistor 810 is controlled by a second constant current circuit 811, and the current value of the second constant current circuit 811 is controlled by a signal from a second current control terminal 812. A third switching transistor 813 and a fourth switching transistor 814 control whether or not the reverse drive transistor 810 applies the reverse bias current to the semiconductor laser device 801. Base current in the third switching transistor 813 and in the fourth switching transistor 814 is controlled by division of a voltage applied to a second switch control terminal 815 by a third bias resistor 816 and a fourth bias resistor 817.

In the drive circuit described above, when the forward drive operation is performed, a high-level signal is input to the first switch control terminal 807, while a low-level signal is input to the second switch control terminal 815. On the other hand, when the reverse drive operation is performed, a low-level signal is input to the first switch control terminal 807, while a high-level signal is input to the second switch control terminal 815. The bias current supplied to the semiconductor laser device 801 during the forward drive operation is determined by the input, to the first current control terminal 804, of the signal from the APC circuit based on the settings of the output power required for each of the reproduction operation and the recording operation. Also, for the reverse bias applied during the reverse driving, the input level of the second current control terminal 812 is controlled so that the reverse bias is 10 µA, for example. The maximum voltage applied during the reverse driving is regulated by the voltage of a power source connected to a power terminal 818. If the power source is a DC-DC converter so that different power supply voltages are used during the forward driving and during the reverse driving, power consumption by the drive circuit is reduced effectively.

In the second embodiment, the semiconductor light source according to the invention is the laser hologram unit 602 included in the optical pickup 601, and the three reverse drive operations that can be performed in combination have been described. As explained with reference to FIG. 7B, if the forward drive operation and the reverse drive operation are repeated in a short cycle during the reproduction period 701, not only deterioration of the semiconductor laser device 603 is suppressed, but also a noise-reducing effect is achievable. Also, as described with reference to FIG. 7C, the reverse drive operation performed during the recording period 702 suppresses deterioration more effectively, because the semiconductor laser device 603 is driven by higher output power during recording than during reproduction. Furthermore, as explained with reference to FIG. 7D, if the reverse drive operation is performed during the idling period 703 other than the reproduction period 701 and the recording period 702, it is possible to have enough time to recover the hydrogen that has moved. Hence, if the reverse drive operation is performed while the semiconductor laser device 603 is heated by the thin-film resistance heater 611, for example, a greater effect is achieved.

The drive circuit shown in FIG. 8, in which the pair of interlock switches 105 shown in FIG. 1 is realized as transistor circuits, is capable of performing switching between the forward drive operation and the reverse drive operation in a short cycle.

Third Embodiment

Hereinafter, a third embodiment of the invention will be described with reference to the accompanying drawings.

Figure 9:
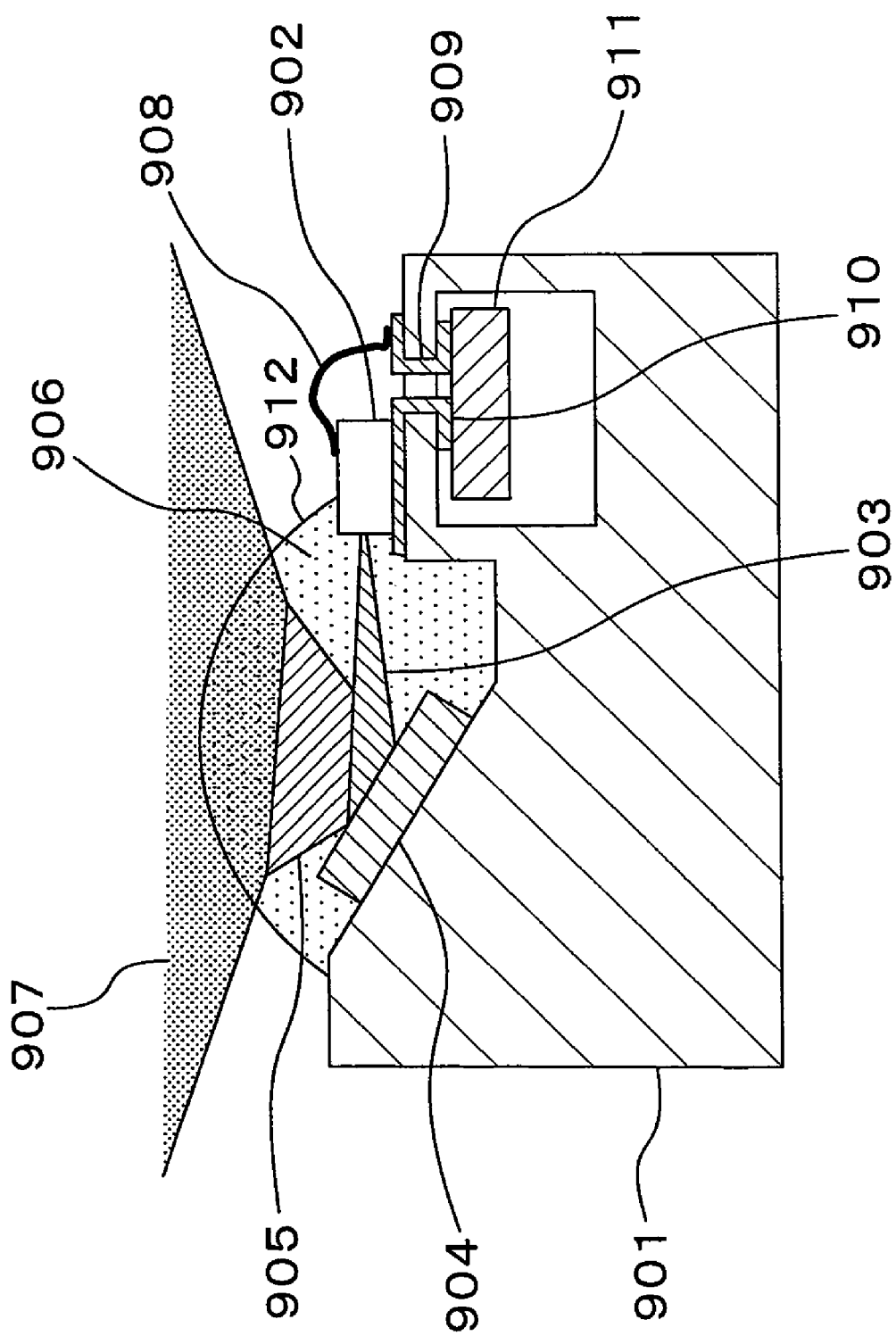
FIG. 9 is a conceptual view illustrating the configuration of a semiconductor light source according to a third embodiment of the invention.

FIG. 9 conceptually illustrates the configuration of a solid-state lighting system which is a semiconductor light source according to the third embodiment of the invention.

As shown in FIG. 9, the semiconductor light source according to the third embodiment includes: a base (mount) 901; a semiconductor laser device 902 fixed to the base 901; a drive circuit 911 in the form of a chip fixed, through a first wire metal 909 and a second wire metal 910, in the upper portion of a cavity formed in the base 901 under the part where the semiconductor laser device 902 is fixed; a diffuse reflector plate 904 fixed on an inclined surface of a recess formed in the upper portion of the base 901 alongside the part where the semiconductor laser device 902 is fixed; and a plastic encapsulant material 912 containing a fluorescent material 906, formed over the diffuse reflector plate 904 and the forward part of the semiconductor laser device 902 so as to cover the recess in the base 901.

The semiconductor laser device 902 has a configuration similar to that of the semiconductor laser chip 201 shown in FIG. 2, for example. In the third embodiment, however, the compositions of nitride semiconductor layers are set as follows so that the oscillation wavelength of the semiconductor laser device 902 is in the ultraviolet region. For instance, an n-type cladding layer 203 has a composition of $Al_{0.18}Ga_{0.82}N$, a first guide layer 204 has a composition of $Al_{0.12}Ga_{0.88}N$, a multi-quantum well active layer 205 has a multilayer structure composed of well layers made of $Ga_{0.99}In_{0.01}N$ and barrier layers made of $Al_{0.09}Ga_{0.91}N$, a second guide layer 206 has a composition of $Al_{0.12}Ga_{0.88}N$, an overflow suppression layer 207 has a composition of $Al_{0.42}Ga_{0.58}N$, and a p-type cladding layer 208 is made of an $Al_{0.36}Ga_{0.64}N$/GaN superlattice.

The p-side electrode of the semiconductor laser device 902 is connected to the drive circuit 911 through a bonding wire 908 and the first wire metal 909, and the n-side electrode thereof is connected to the drive circuit 911 through the second wire metal 910.

Ultraviolet laser light 903 emitted from the semiconductor laser device 902 is reflected by the diffuse reflector plate 904 and is output upwardly as ultraviolet scattered light 905. The fluorescent material 906 added to the plastic encapsulant material 912 is excited by the output ultraviolet laser light 903 and ultraviolet scattered light 905, thereby producing visible light 907, which is output externally.

It should be noted that the drive circuit 911 may be composed of electronic circuits only such as shown in FIG. 8 or may also have a hybrid structure using mechanical switches as a pair of interlock switches as shown in FIG. 1.

The semiconductor laser device 902 according to the third embodiment is driven by the drive circuit 911 while being switched back and forth between forward drive operation and reverse drive operation. This switching may be performed by the following two driving methods.

In the first driving method, the drive circuit 911 is composed of electronic circuits only, and the switching frequency is equal to or higher than a frequency of the commercial power supply (50 Hz or 60 Hz). According to this method, the average output of the semiconductor laser device 902 is used as visible light. When the switching frequency is set to the frequency of the commercial power supply, flicker in the lighting is about the same as that in conventional fluorescent lamps. And if the switching is performed at a frequency sufficiently higher than the frequency of the commercial power supply, non-flickering lighting, like conventional inverter-including fluorescent lamps, is also achievable.

In the second driving method, reverse drive operation is performed during periods of time in which the solid-state lighting system is in the off state. Considering that a typical light is often off during the daytime, if reverse drive operation is performed while the light is off, it is possible to have enough time to recover the hydrogen that has moved. When the second driving method is adopted, the drive circuit 911 may have the configuration shown in FIG. 1 in which mechanical switches are used as the pair of interlock switches.

Furthermore, if constant current diodes are used as the first constant current circuit 104 and as the second constant current circuit 108 shown in FIG. 1, the drive circuit 911 according to the invention can have a quite simple circuit configuration, thereby enabling the price of the solid-state lighting system to be lowered effectively.

Fourth Embodiment

Hereinafter, light-emitting device drive circuits according to a fourth embodiment of the invention will be described.

The fourth embodiment of the invention is the drive circuit 102 shown in FIG. 1 and the drive circuit shown in FIG. 8. When used in combination with a semiconductor laser device, these drive circuits for light-emitting devices provide the functions and effects described in the first to third embodiments, however, these drive circuits are also available by themselves as products. In the field of semiconductor laser devices, in particular, aging test equipment and accelerated test equipment for estimating the life of semiconductor laser devices are often used. Also, in a case where a light-emitting device is a light-emitting diode, a lighting product composed of only a drive circuit is available in which the light-emitting diode is replaceable.

Therefore, even a drive circuit that does not include a light-emitting device itself, such as a semiconductor laser device or a light-emitting diode, is an embodiment of the invention, so long as that drive circuit drives a light-emitting device made of nitride semiconductors and suppresses deterioration caused by movement of hydrogen by performing reverse drive operation.

Fifth Embodiment

Hereinafter, a fifth embodiment of the invention will be described with reference to the accompanying drawings.

Figure 10:
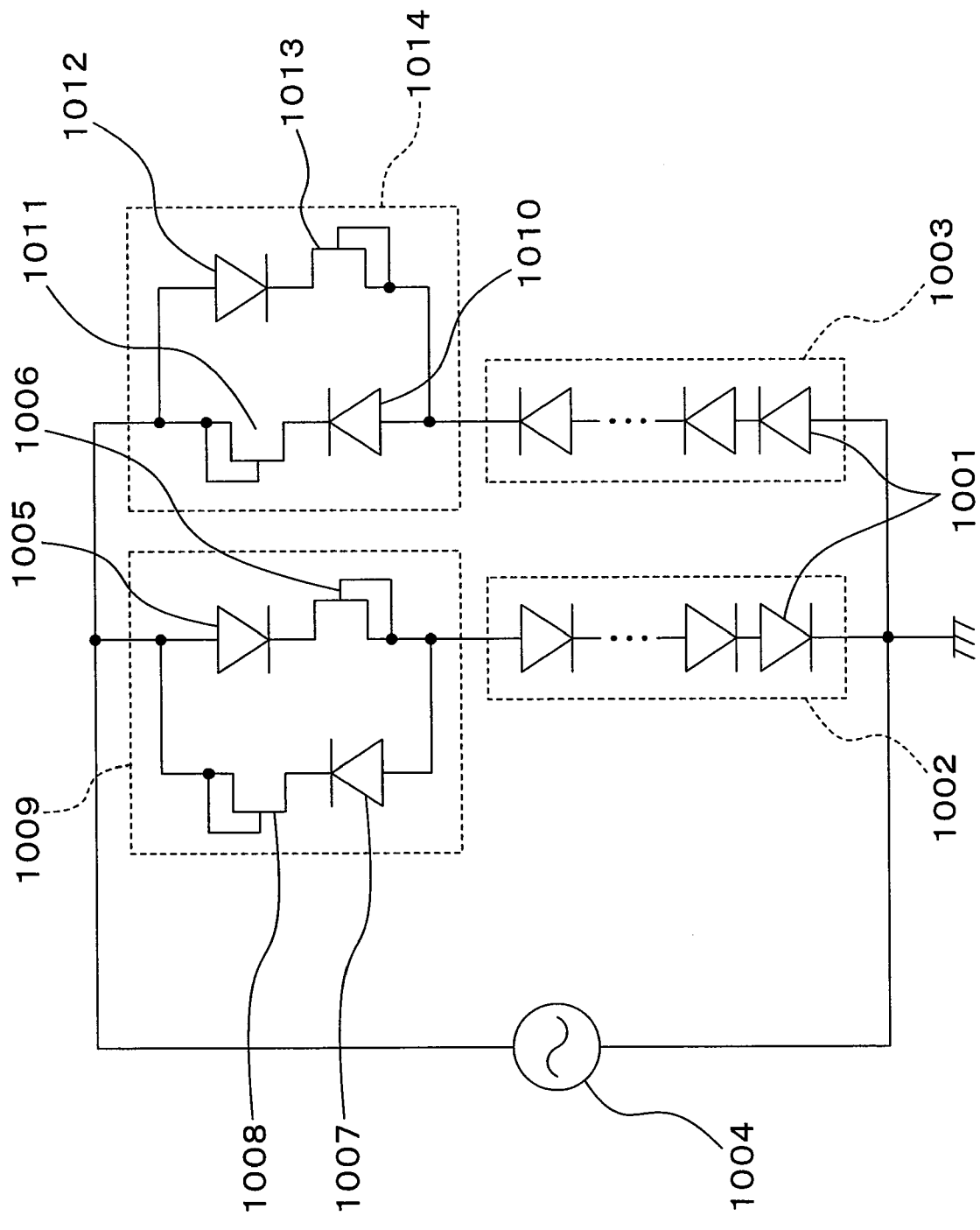
FIG. 10 is a circuit diagram illustrating a semiconductor light source according to a fifth embodiment of the invention.
Figure 11:
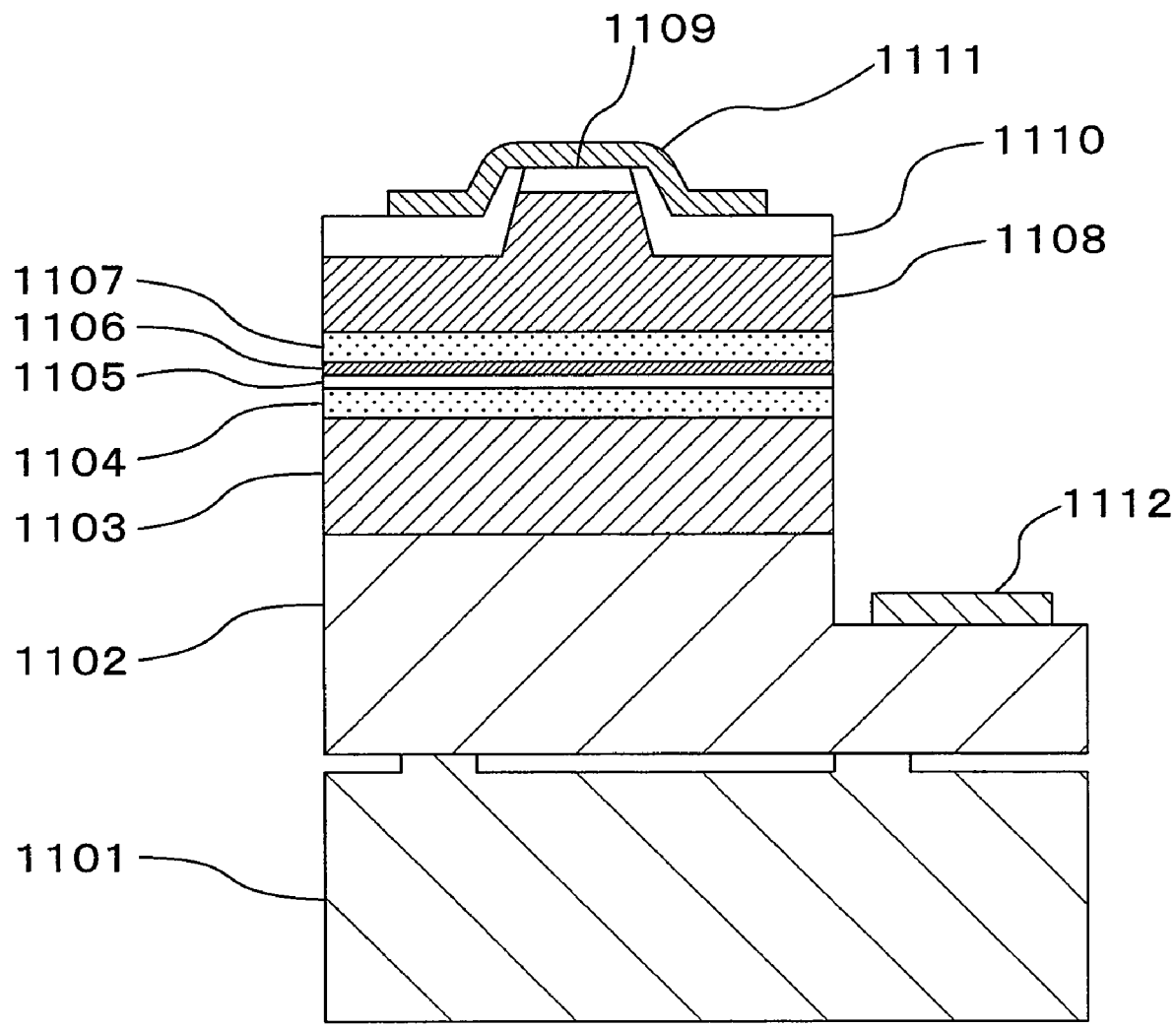
FIG. 11 is a cross-sectional view illustrating a conventional semiconductor laser chip.

FIG. 10 shows the circuit configuration of a solid-state lighting system, which is a semiconductor light source using light-emitting diodes made of nitride semiconductors according to the fifth embodiment of the invention.

As shown in FIG. 10, a first light-emitting diode unit 1002 and a second light-emitting diode unit 1003, in each of which a plurality of white light emitting diodes 1001 are connected in series, are connected with an AC power supply (a lamp line) 1004. The first light-emitting diode unit 1002 and the second light-emitting diode unit 1003 alternately emit light for the half wave of a sinusoidal voltage supplied from the AC power supply 1004 and function as a lighting system.

A first rectifier diode 1005 and a first constant current diode 1006 are connected in series with the first light-emitting diode unit 1002, and during periods of time in which a forward sinusoidal voltage is applied to each light-emitting diode 1001 and to the first rectifier diode 1005, a forward drive current is supplied to each light-emitting diode 1001 so as to make the light-emitting diodes 1001 emit light.

The series-connected pair of the first rectifier diode 1005 and the first constant current diode 1006 is connected in parallel with a series-connected pair of a second rectifier diode 1007 and a second constant current diode 1008. This series-connected pair of the second rectifier diode 1007 and the second constant current diode 1008 performs reverse drive operation during periods of time in which a reverse sinusoidal voltage is applied to the light-emitting diodes 1001. Thus, the circuit composed of the first rectifier diode 1005, the second rectifier diode 1007, the first constant current diode 1006, and the second constant current diode 1008 is a first drive circuit 1009 for the light-emitting diodes 1001 included in the first light-emitting diode unit 1002. The first and second constant current diodes 1006 and 1008, each of which is obtained by establishing a short-circuit between the gate and source of a normally-on field-effect transistor, and in which the current flowing from the drain to the source becomes saturated at a certain value, function as constant current diodes. Nevertheless, the saturation current value of the first constant current diode 1006 greatly differs from that of the second constant current diode 1008. The saturation current value of the first constant current diode 1006 corresponding to the forward driving is from several tens mA to several hundreds mA, while the saturation current value of the second constant current diode 1008 corresponding to the reverse driving is about 10 µA.

A second drive circuit 1014, like the first drive circuit 1009, is composed of a series-connected pair of a third rectifier diode 1010 and a third constant current diode 1011 and a series-connected pair of a fourth rectifier diode 1012 and a fourth constant current diode 1013, which is connected in parallel with the series-connected pair of the third rectifier diode 1010 and the third constant current diode 1011. The second drive circuit 1014 is connected in series with the second light-emitting diode unit 1003 and operates in the same manner as the first drive circuit 1009 except that the second light-emitting diode unit 1003 is driven in the forward direction during the periods of time in which the first light-emitting diode unit 1002 is driven in the reverse direction, whereas the second light-emitting diode unit 1003 is driven in the reverse direction during the periods of time in which the first light-emitting diode unit 1002 is driven in the forward direction.

The first light-emitting diode unit 1002 and the second light-emitting diode unit 1003 may be mounted on a single package. In that case, all of the light-emitting diodes 1001 included in the light-emitting diode units 1002 and 1003 are connected in series, and both terminals and a middle part thereof are connected to external terminals. If the package thus configured is incorporated into a drive circuit composed of rectifier diodes and constant current diodes, it is possible to achieve a configuration in which the package composed of only the light-emitting diode units is replaceable.

Moreover, all of the components (except for the AC power supply 1004) shown in FIG. 10 may be modularized. In that case, if an external terminal attachable to a bulb socket is provided, a solid-state lighting system replaceable with a conventional bulb is achieved.

It should be noted that the light-emitting device drive circuits composed of the rectifier diodes and the constant current diodes shown in FIG. 10 are only examples of drive circuits. The point of this embodiment is to provide a forward drive circuit for supplying a forward current to make light-emitting diodes emit light, a reverse drive circuit for applying a reverse bias to the light-emitting diodes, and a constant current circuit for limiting the value of a reverse current flowing through the light-emitting diodes, and these components produce the functions and effects of the invention.

INDUSTRIAL APPLICABILITY

The semiconductor light sources according to the invention include highly reliable nitride light-emitting devices, in which the mechanism of hydrogen-caused deterioration is suppressed, and are thus applicable to optical pickups, solid-state lighting systems, and the like.

The invention claimed is:
1. A semiconductor light source comprising:
   a semiconductor laser device including a plurality of semiconductor layers made of nitride semiconductors; and
   a drive circuit for driving the semiconductor laser device,
   wherein the drive circuit performs forward drive operation,
      in which a forward current is supplied to the semicon- ductor laser device to make the semiconductor laser device oscillate, and reverse drive operation, in which a reverse bias is applied to the semiconductor laser device; and a reverse drive period in which the reverse drive operation is performed is set within a laser-off period in which the forward drive operation is not performed, and wherein the plurality of semiconductor layers include an active layer and a p-type cladding layer which contains hydrogen atoms; and the reverse drive operation suppresses movement of the hydrogen atoms in the p-type cladding layer toward the active layer.

2. The semiconductor light source of claim 1, wherein the magnitude of the reverse bias is limited by the value of a reverse current flowing through the semiconductor laser device.

3. The semiconductor light source of claim 1, wherein an overflow suppression layer for suppressing an overflow of carriers from the active layer is provided between the active layer and the p-type cladding layer.

4. The semiconductor light source of claim 3, wherein the p-type cladding layer and the overflow suppression layer are doped with magnesium.

5. The semiconductor light source of claim 1, further comprising:

a light receiving device for receiving laser light emitted from the semiconductor laser device and reflected by an optical disk, wherein a switching cycle in which switching between the forward drive operation and the reverse drive operation is performed is shorter than a cycle of a reproduction signal detected by the light receiving device in accordance with data recorded on the optical disk.

6. The semiconductor light source of claim 1, further comprising:

a light receiving device for receiving laser light emitted from the semiconductor laser device and reflected by an optical disk, wherein switching between the forward drive operation and the reverse drive operation is performed in accordance with data to be recorded on the optical disk, thereby recording the data on the optical disk.

7. The semiconductor light source of claim 1, further comprising:

a light receiving device for receiving laser light emitted from the semiconductor laser device and reflected by an optical disk, wherein the reverse drive operation is performed during a period of time other than a period of time in which data recorded on the optical disk is reproduced and other than a period of time in which other data is recorded on the optical disk.

8. The semiconductor light source of claim 7, further comprising:

a heater for heating the semiconductor laser device, wherein a heat period in which the semiconductor laser device is heated by the heater is set within the laser-off period; and the heat period and the reverse drive period coincide with each other.

9. The semiconductor light source of claim 1, further comprising:

fluorescent material, which is excited by laser light emitted from the semiconductor laser device, wherein a switching frequency at which switching between the forward drive operation and the reverse drive operation is performed is equal to or higher than a frequency of a commercial power supply.

10. The semiconductor light source of claim 1, further comprising:

fluorescent material, which is excited by laser light emitted from the semiconductor laser device, wherein the reverse drive operation is performed during a period of time other than a period of time in which light emitted from the fluorescent material is used.

11. A light-emitting device drive circuit for driving a semiconductor laser device including a plurality of semiconductor layers made of nitride semiconductors, the light-emitting device drive circuit comprising:

a forward drive circuit for supplying a forward current to the semiconductor laser device to make the semiconductor laser device oscillate;

a reverse drive circuit for applying a reverse bias to the semiconductor laser device; and a switching circuit for performing switching between the forward drive circuit and the reverse drive circuit, thereby connecting either the forward drive circuit or the reverse drive circuit with the semiconductor laser device, wherein the plurality of semiconductor layers include an active layer and a p-type cladding layer which contains hydrogen atoms; and the reverse drive operation suppresses movement of the hydrogen atoms in the p-type cladding layer toward the active layer.

12. A semiconductor light source comprising:

a light-emitting device including a plurality of semiconductor layers made of nitride semiconductors; and a drive circuit for driving the light-emitting device, wherein the drive circuit performs forward drive operation, in which a forward current is supplied to the light-emitting device to make the light-emitting device emit light, and reverse drive operation, in which a reverse bias is applied to the light-emitting device; and the magnitude of the reverse bias is limited by the value of a reverse current flowing through the light-emitting device, and wherein the plurality of semiconductor layers include an active layer and a p-type cladding layer which contains hydrogen atoms; and the reverse drive operation suppresses movement of the hydrogen atoms in the p-type cladding layer toward the active layer.

13. A light-emitting device drive circuit for driving a light-emitting device including a plurality of semiconductor layers made of nitride semiconductors; the light-emitting device drive circuit comprising:

a forward drive circuit for supplying a forward current to the light-emitting device to make the light-emitting device emit light;

a reverse drive circuit for applying a reverse bias to the light-emitting device; and a constant current circuit for limiting the value of a reverse current flowing though the light-emitting device, wherein the plurality of semiconductor layers include an active layer and a p-type cladding layer which contains hydrogen atoms; and the reverse drive operation suppresses movement of the hydrogen atoms in the p-type cladding layer toward the active layer.

* * * * *